United States Patent
Lee et al.

(10) Patent No.: US 11,212,069 B2
(45) Date of Patent: *Dec. 28, 2021

(54) METHOD OF CALIBRATING CLOCK PHASE AND VOLTAGE OFFSET, DATA RECOVERY CIRCUIT PERFORMING THE SAME AND RECEIVER INCLUDING THE SAME

(71) Applicant: SAMSUNG ELECTRONICS CO., LTD., Suwon-si (KR)

(72) Inventors: Soomin Lee, Hwaseong-si (KR); Kihwan Seong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/219,187

(22) Filed: Mar. 31, 2021

(65) Prior Publication Data
US 2021/0250161 A1    Aug. 12, 2021

Related U.S. Application Data

(63) Continuation of application No. 16/715,289, filed on Dec. 16, 2019, now Pat. No. 10,972,248.

(30) Foreign Application Priority Data
May 27, 2019   (KR) .................. 10-2019-0061686

(51) Int. Cl.
*H04L 7/00*     (2006.01)
*H03L 7/081*    (2006.01)
(Continued)

(52) U.S. Cl.
CPC .......... *H04L 7/0037* (2013.01); *H03L 7/0807* (2013.01); *H03L 7/0812* (2013.01);
(Continued)

(58) Field of Classification Search
CPC ..... H04L 7/0037; H04L 7/0087; H04L 7/042; H03L 7/0807; H03L 7/0812; H03L 7/0891; H03L 7/091
See application file for complete search history.

(56) References Cited

U.S. PATENT DOCUMENTS 6,269,012 B1   7/2001  Kusakabe et al.
6,415,004 B1 * 7/2002  Fujimura ............ H04L 7/0334
                                                 329/306
(Continued)

*Primary Examiner* — David B Lugo
(74) *Attorney, Agent, or Firm* — Myers Bigel, P.A.

(57) ABSTRACT

A method of calibrating a clock phase and a voltage offset includes receiving an input data signal that is periodically toggled. A clock phase calibration operation is performed based on an up signal and a down signal, such that phases of a plurality of clock signals are adjusted. The up signal and the down signal are generated based on the input data signal, a reference voltage and the plurality of clock signals. A voltage offset calibration operation is performed based on the up signal, the down signal and a first sample data signal, such that a voltage level of the reference voltage is adjusted. The first sample data signal is generated by sampling the input data signal based on one of the plurality of clock signals. The clock phase calibration operation and the voltage offset calibration operation are performed independently of each other and not to overlap with each other.

23 Claims, 26 Drawing Sheets

(51) Int. Cl.
  *H03L 7/089* (2006.01)
  *H04L 7/04* (2006.01)
  *H03L 7/08* (2006.01)
  *H03K 19/21* (2006.01)

(52) U.S. Cl.
  CPC ............ *H03L 7/0891* (2013.01); *H04L 7/042* (2013.01); *H03K 19/21* (2013.01); *H04L 7/0087* (2013.01)

(56) References Cited

U.S. PATENT DOCUMENTS

| | | |
|---|---|---|
| 6,737,995 B2 | 5/2004 | Ng et al. |
| 7,932,785 B2 | 4/2011 | Drapkin et al. |
| 8,134,876 B2 | 3/2012 | Choi et al. |
| 8,204,154 B2 | 6/2012 | Min et al. |
| 8,253,470 B2 | 8/2012 | Mulder |
| 8,537,950 B2 | 9/2013 | Han et al. |
| 9,203,364 B2 | 12/2015 | Abe et al. |
| 9,401,721 B1 | 7/2016 | Barakat et al. |
| 9,496,012 B2 | 11/2016 | Yildirim et al. |
| 10,972,248 B2 * | 4/2021 | Lee ................... H04L 7/033 |
| 2005/0237086 A1 | 10/2005 | Galloway et al. |
| 2015/0207618 A1 * | 7/2015 | Tsunoda ............ H04L 7/0331 375/374 |

* cited by examiner

FIG. 13

| # | UP[0:3] | DN[0:3] | DO | ACTION |
|---|---------|---------|-----|----------------|
| CASE1-1 | '1010' | '0101' | '1' | DECREASE VREF |
| CASE1-2 | '0101' | '1010' | '0' | DECREASE VREF |
| CASE1-3 | '0000' | '0000' | '0' | DECREASE VREF |
| CASE1-4 | '0101' | '1010' | '1' | INCREASE VREF |
| CASE1-5 | '1010' | '0101' | '0' | INCREASE VREF |

FIG. 21

| # | UP[0:3] | DN[0:3] | ACTION |
|---|---|---|---|
| CASE2-1 | UP < DN | | INCREASE CLK DELAY |
| CASE2-2 | UP > DN | | DECREASE CLK DELAY |
| CASE2-3 | '1010' | '1010' | DECREASE CLK DELAY |
| CASE2-4 | '0101' | '0101' | DECREASE CLK DELAY |

METHOD OF CALIBRATING CLOCK PHASE AND VOLTAGE OFFSET, DATA RECOVERY CIRCUIT PERFORMING THE SAME AND RECEIVER INCLUDING THE SAME

CROSS-REFERENCE TO RELATED APPLICATIONS

This application is a continuation of U.S. patent application Ser. No. 16/715,289, filed Dec. 16, 2019, which itself claims priority under 35 USC § 119 to Korean Patent Application No. 10-2019-0061686, filed on May 27, 2019 in the Korean Intellectual Property Office (KIPO), the contents of both of which are herein incorporated by reference in their entireties.

BACKGROUND

1. Technical Field

The present disclosure relates generally to semiconductor integrated circuits, and more particularly to methods of calibrating clock phases and voltage offsets, data recovery circuits performing the methods, and receivers including the data recovery circuits.

2. Description of the Related Art

Electronic systems using semiconductor integrated circuit (IC) technology may have communication between chips that need fast speed and wide bandwidth. Accordingly, the communication chips may include a data recovery circuit to receive input data signals at higher speeds. To accurately detect and determine the input data signals, the data recovery circuit may need to precisely and accurately calibrate a clock phase and a voltage offset or (or an input offset). Researchers are conducting various research projects on techniques of efficiently performing the clock phase calibration and the voltage offset calibration.

SUMMARY

At least one example embodiment of the present disclosure provides a method of calibrating a clock phase and a voltage offset capable of reducing power consumption and circuit size, and ensuring operational stability.

At least one example embodiment of the present disclosure provides a data recovery circuit performing the method.

At least one example embodiment of the present disclosure provides a receiver including the data recovery circuit.

According to example embodiments, in a method of calibrating a clock phase and a voltage offset, an input data signal that is periodically toggled is received. A clock phase calibration operation is performed based on an up signal and a down signal. Phases of a plurality of clock signals are adjusted by the clock phase calibration operation. The up signal and the down signal are generated based on the input data signal, a reference voltage and the plurality of clock signals. A voltage offset calibration operation is performed based on the up signal, the down signal and a first sample data signal. A level of the reference voltage is adjusted by the voltage offset calibration operation. The first sample data signal is generated by sampling the input data signal based on one of the plurality of clock signals. The clock phase calibration operation and the voltage offset calibration operation are performed independently of each other and not to overlap with each other.

According to example embodiments, a data recovery circuit includes an analog front-end (AFE), a sampler, a phase detector and a finite state machine (FSM). The analog front-end receives an input data signal, and generates a data signal corresponding to the input data signal based on the input data signal and a reference voltage. The sampler samples the data signal based on a plurality of clock signals to generate a plurality of sample data signals. The phase detector generates an up signal and a down signal based on the plurality of sample data signals. The finite state machine performs a clock phase calibration operation based on the up signal and the down signal, and performs a voltage offset calibration operation based on the up signal, the down signal and a first sample data signal among the plurality of sample data signals. Phases of the plurality of clock signals are adjusted by the clock phase calibration operation. A level of the reference voltage is adjusted by the voltage offset calibration operation. The clock phase calibration operation and the voltage offset calibration operation are performed independently of each other and not to overlap with each other.

According to example embodiments, a receiver includes a data recovery circuit. The data recovery circuit receives an input data signal that is provided via a communication channel. The data recovery circuit includes an analog front-end (AFE), a sampler, a phase detector and a finite state machine (FSM). The analog front-end receives the input data signal, and generates a data signal corresponding to the input data signal based on the input data signal and a reference voltage. The sampler samples the data signal based on a plurality of clock signals to generate a plurality of sample data signals. The phase detector generates an up signal and a down signal based on the plurality of sample data signals. The finite state machine performs a clock phase calibration operation based on the up signal and the down signal, and performs a voltage offset calibration operation based on the up signal, the down signal and a first sample data signal among the plurality of sample data signals. Phases of the plurality of clock signals are adjusted by the clock phase calibration operation. A level of the reference voltage is adjusted by the voltage offset calibration operation. The clock phase calibration operation and the voltage offset calibration operation are performed independently of each other and not to overlap with each other.

In the data recovery circuit and the method of calibrating the clock phase and the voltage offset according to example embodiments, the optimal phase of the plurality of clock signals and the optimal offset level of the reference voltage may be detected together and at once based on the up signal and the down signal. In other words, the voltage offset calibration operation may be performed using signals and circuit configurations for performing the clock phase calibration operation, without using additional signals and circuit configurations for performing the voltage offset calibration operation, and thus power consumption and circuit area may be reduced. Further, the clock phase calibration operation and the voltage offset calibration operation may be performed independently of each other and not to overlap with each other, and thus operational stability may be ensured or guaranteed.

BRIEF DESCRIPTION OF THE DRAWINGS

Illustrative, non-limiting example embodiments will be more clearly understood from the following detailed description taken in conjunction with the accompanying drawings.

FIGS. 7, 8, 9, 10, 11, 12 and 13 are diagrams for describing the voltage offset calibration operation of FIG. 6, according to example embodiments.

FIGS. 15, 16, 17, 18, 19, 20 and 21 are diagrams for describing the clock phase calibration operation of FIG. 14, according to example embodiments.

DETAILED DESCRIPTION OF THE EMBODIMENTS

Figure 1:
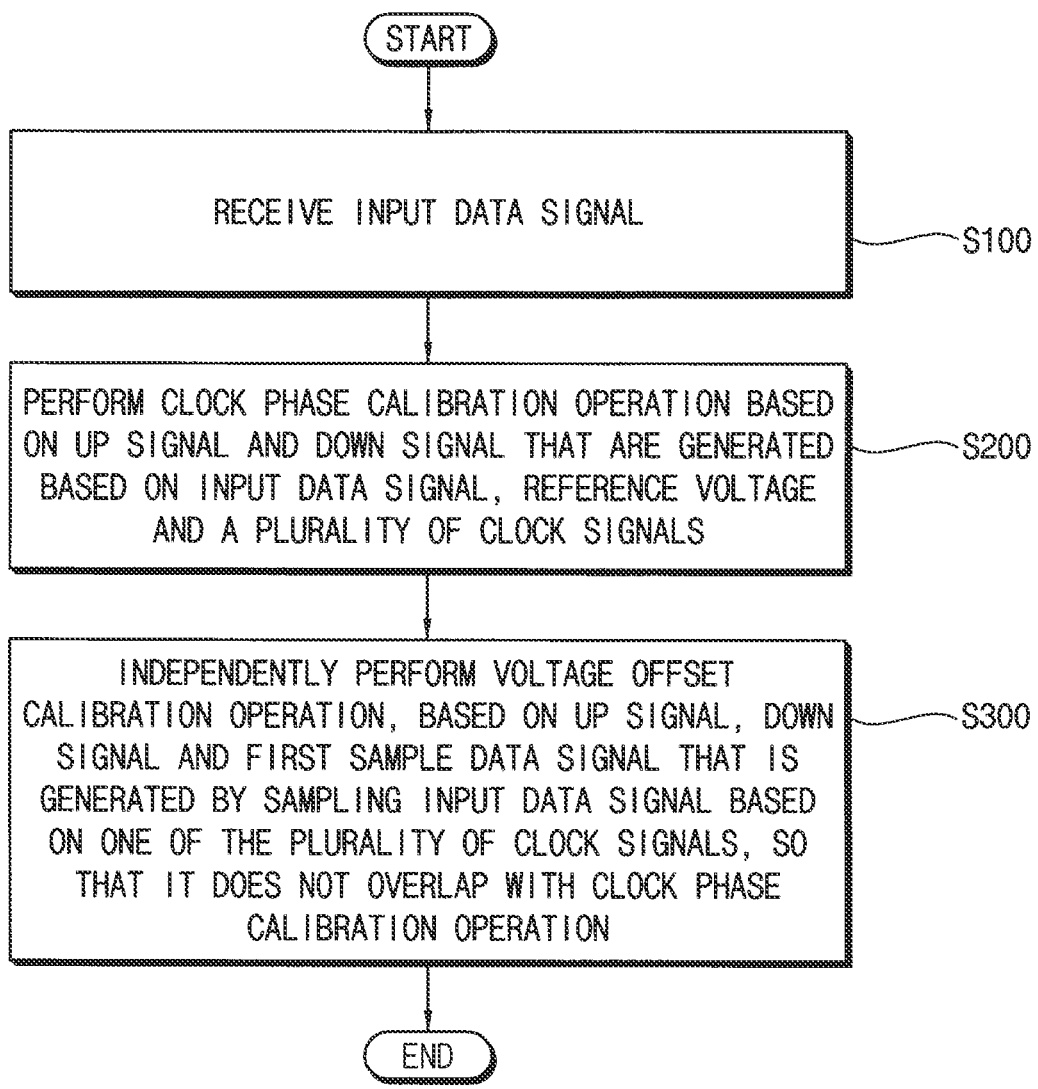
FIG. 1 is a flowchart illustrating a method of calibrating a clock phase and a voltage offset, according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of calibrating a clock phase and a voltage offset, according to example embodiments.

Referring to FIG. 1, when an adaptive phase and voltage calibration operation starts by a method of calibrating a clock phase and a voltage offset according to example embodiments, an input data signal that is regularly or periodically toggled is received (step S100). For example, the input data signal may have a pattern of '0101' that is repeated periodically.

A clock phase calibration operation is performed based on an up signal and a down signal (step S200). Phases of a plurality of clock signals are adjusted by the clock phase calibration operation. The up signal and the down signal are generated based on the input data signal, a reference voltage and/or the plurality of clock signals. Detailed examples of the clock phase calibration operation based on the up signal and the down signal will be described with reference to FIGS. 14 through 21.

A voltage offset calibration operation is performed based on the up signal, the down signal and/or a first sample data signal (step S300). A level of the reference voltage is adjusted by the voltage offset calibration operation. The first sample data signal is generated by sampling the input data signal based on one of the plurality of clock signals. In other words, a plurality of sample data signals may be generated by sampling the input data signal based on the plurality of clock signals, and the first sample data signal may be one of the plurality of sample data signals. Detailed examples of the voltage offset calibration operation based on the up signal, the down signal and/or the first sample data signal will be described with reference to FIGS. 6 through 13.

The clock phase calibration operation and the voltage offset calibration operation are performed independently of each other and may not overlap in time with each other, such that the clock phase calibration operation does not affect the voltage offset calibration operation. In other words, a first condition of the up signal and the down signal in which a clock phase calibration loop for the clock phase calibration operation is driven, activated, and/or triggered may be different from a second condition of the up signal and the down signal in which a voltage offset calibration loop for the voltage offset calibration operation is driven, activated, and/or triggered.

Although FIG. 1 illustrates an example where the clock phase calibration operation is performed first and the voltage offset calibration operation is performed later, an order in which such two operations are performed may be changed according to example embodiments. In addition, although FIG. 1 illustrates an example where the clock phase calibration operation is performed once, the voltage offset calibration operation is performed once, and the adaptive phase and voltage calibration operation is terminated. The clock phase calibration operation and the voltage offset calibration operation may be repeatedly performed in practice until each of the plurality of clock signals has an optimal phase and the reference voltage has an optimal offset level, as will be described with reference to FIG. 2.

In the method of calibrating the clock phase and the voltage offset according to example embodiments, the optimal phase of the plurality of clock signals and the optimal offset level of the reference voltage may be detected together and/or at once based on the up signal and the down signal. In other words, the voltage offset calibration operation may be performed using signals and circuit configurations for performing the clock phase calibration operation, without using additional signals and circuit configurations for performing the voltage offset calibration operation. Thus power consumption and circuit area may be reduced. Further, the clock phase calibration operation and the voltage offset calibration operation may be performed independently of each other and may not overlap in time with each other, and thus operational stability may be ensured or guaranteed.

Figure 2:
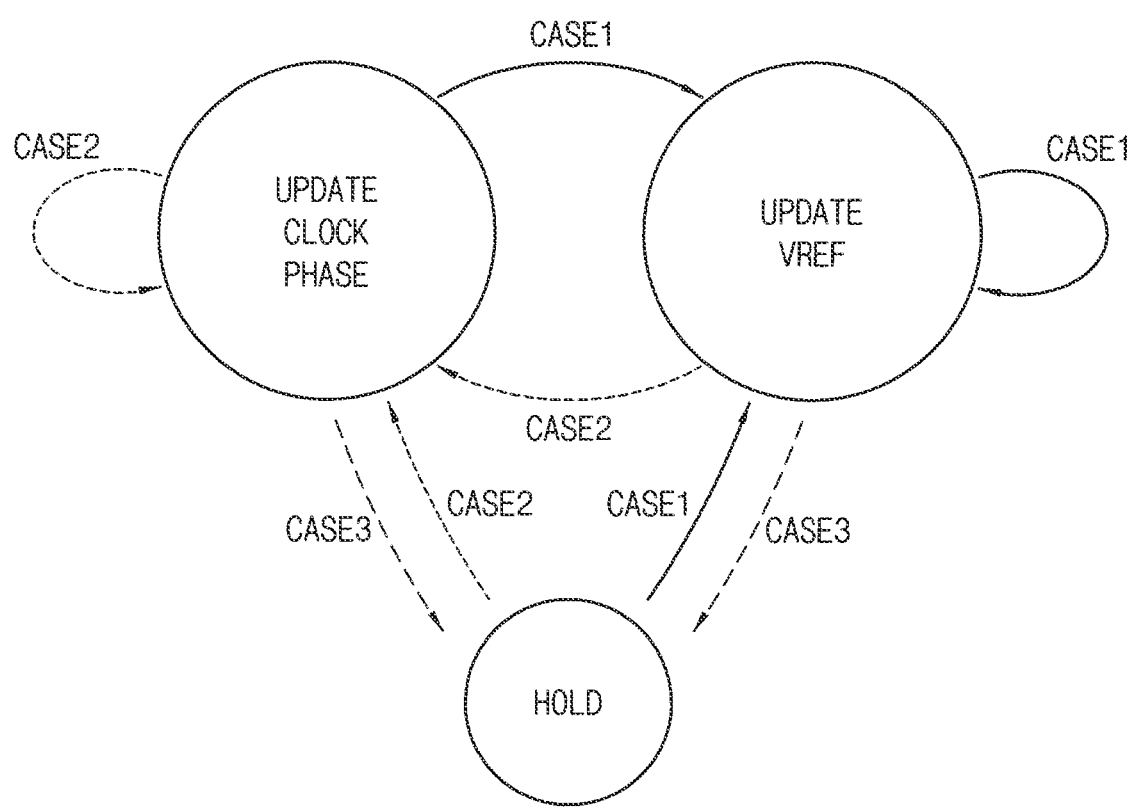
FIGS. 2 and 3 are diagrams for describing a clock phase calibration operation and a voltage offset calibration operation that are performed in the method of FIG. 1, according to example embodiments.
Figure 3:
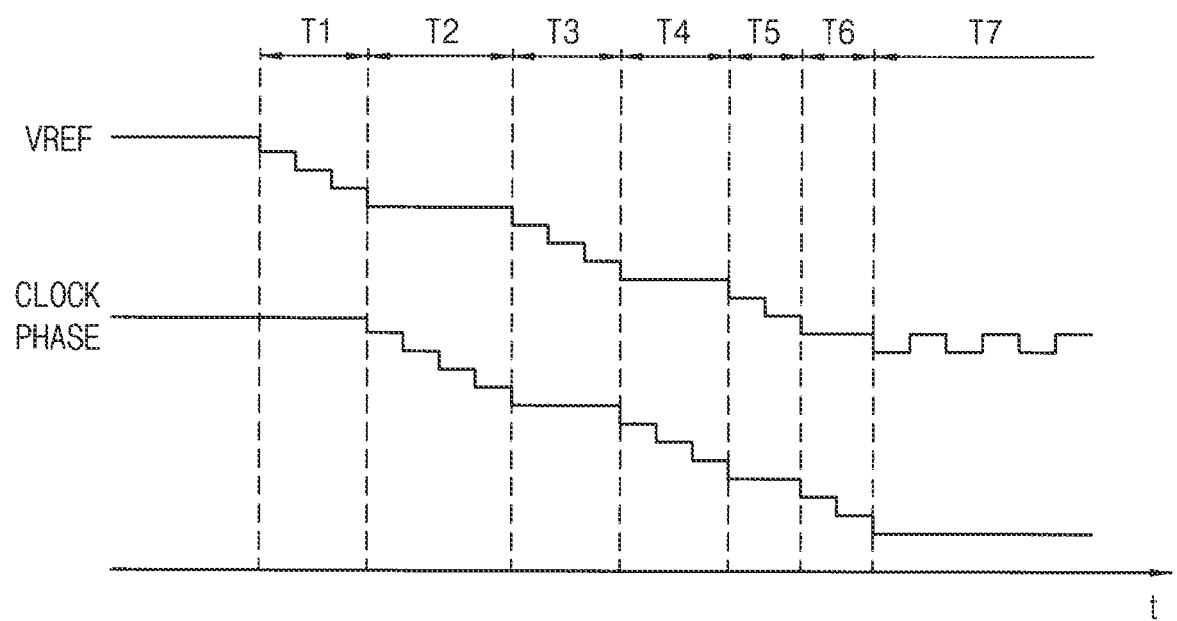

FIGS. 2 and 3 are diagrams for describing a clock phase calibration operation and/or a voltage offset calibration operation that are performed in FIG. 1.

Referring to FIGS. 1 and 2, when the input data signal, that may be regularly or periodically toggled, is received, and when the up signal and the down signal that are generated based on the input data signal, a reference voltage VREF, and the plurality of clock signals satisfy or comply with a first condition (or a first case) CASE1, the voltage offset calibration operation for updating the voltage level of the reference voltage VREF is performed as described with reference to step S300 of FIG. 1. For example, the voltage level of the reference voltage VREF may be increased or decreased based on a combination of the up signal, the down signal, and/or the first sample data signal, and this will be described in detail with reference to FIGS. 7 through 13.

When the up signal and the down signal satisfy or comply with a second condition (or a second case) CASE2 that is different from the first condition CASE1, the clock phase calibration operation for adjusting the phases of the plurality of clock signals is performed as described with reference to step S200 of FIG. 1. For example, delays of the plurality of clock signals may be increased or decreased based on a combination of the up signal and the down signal, and this will be described in detail with reference to FIGS. 15 through 21.

When the up signal and the down signal satisfy or comply with a third condition (or a third case) CASE3, other than the first condition CASE1 and the second condition CASE2, the voltage level of the reference voltage VREF and the phases of the plurality of clock signals may not be changed, and may be maintained or held to a current voltage level and/or current phases, respectively. FIG. 2 illustrates a HOLD phase that corresponds to the maintaining the voltage level of the reference voltage VREF at a current voltage level and/or current phase based on the third condition, CASE 3.

Referring to FIG. 3, the voltage offset calibration operation for updating the voltage level of the reference voltage VREF may be performed during time intervals T1, T3 and T5, which may correspond to the UPDATE VREF phase of FIG. 2. The clock phase calibration operation for adjusting the phases of the plurality of clock signals may be performed during time intervals T2, T4 and T6, which may correspond to the UPDATE CLOCK PHASE of FIG. 2. As a result, the reference voltage VREF and the plurality of clock signals may be stabilized during a time interval T7 such that the reference voltage VREF has the optimal or an improved voltage offset level and each of the plurality of clock signals has the optimal or an improved clock phase. Since the first condition CASE1 and the second condition CASE2 are different from each other as described with reference to FIGS. 1 and 2, the clock phase calibration operation and the voltage offset calibration operation may be performed independently of each other and may not overlap in time with each other.

Figure 4:
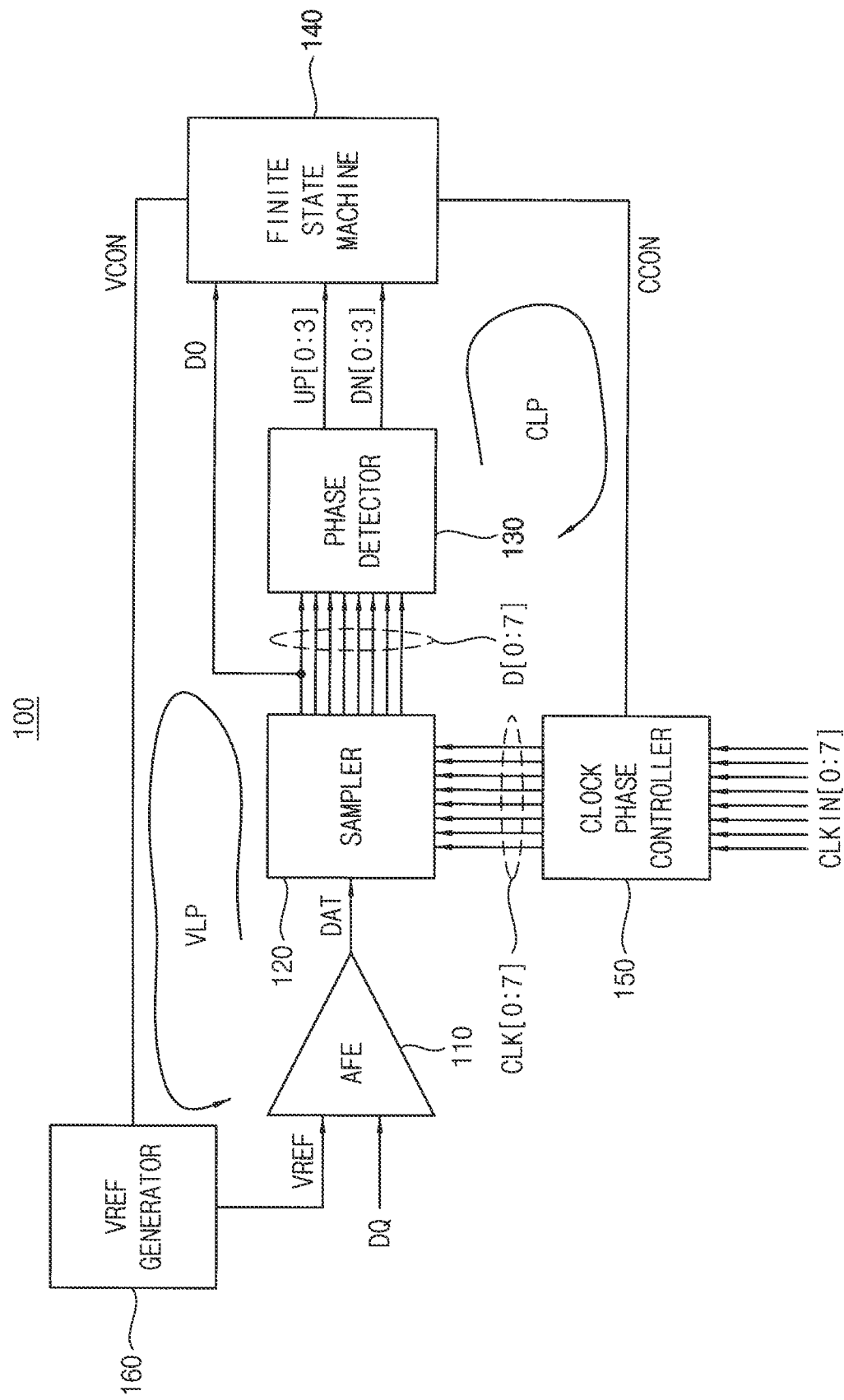
FIG. 4 is a block diagram illustrating a data recovery circuit, according to example embodiments.
Figure 5:
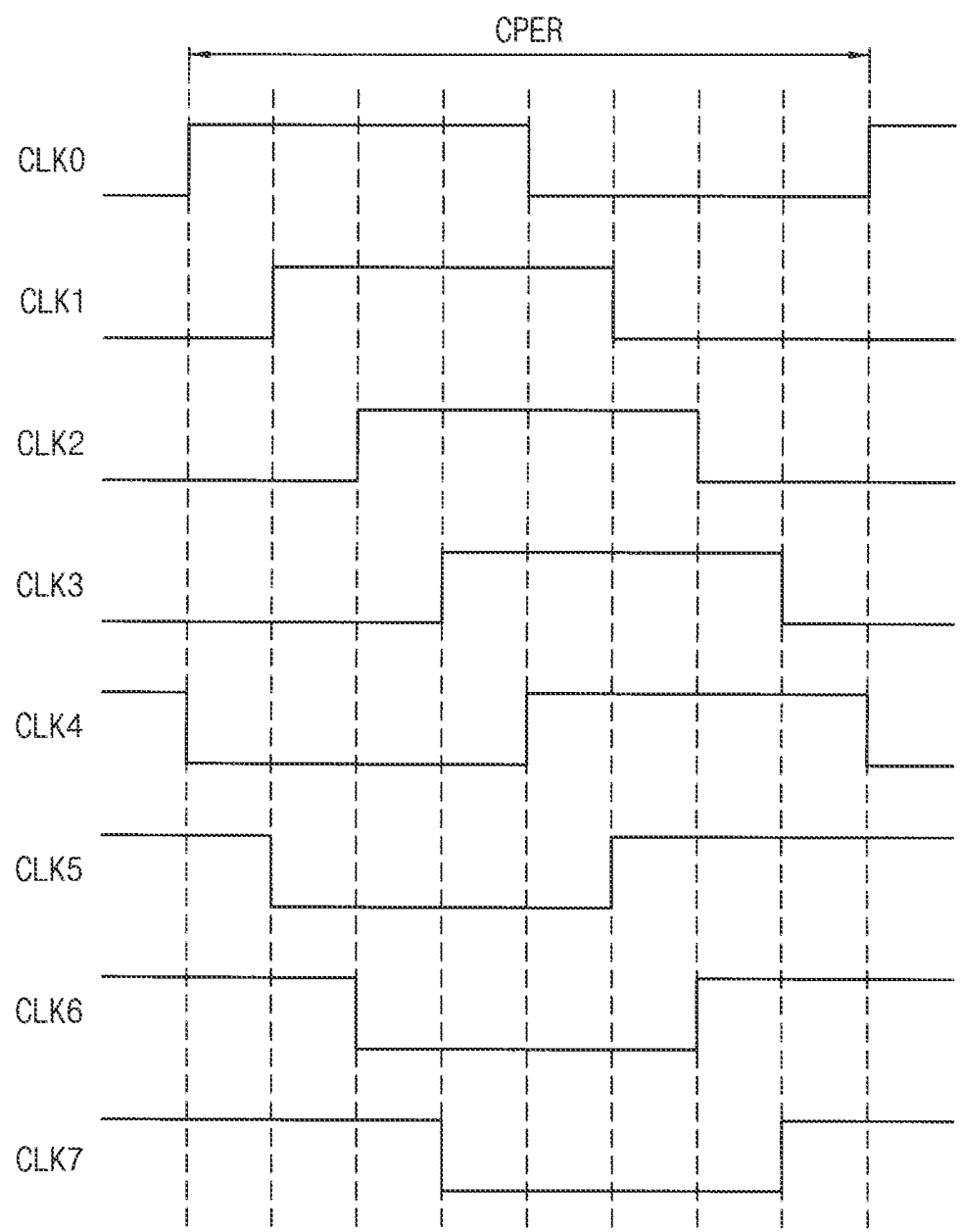
FIG. 5 is a timing diagram illustrating an example of a plurality of clock signals that are generated from the data recovery circuit of FIG. 4, according to example embodiments.

FIG. 4 is a block diagram illustrating a data recovery circuit according to example embodiments. FIG. 5 is a timing diagram illustrating an example of a plurality of clock signals that are generated from the data recovery circuit of FIG. 4.

Referring to FIGS. 4 and 5, a data recovery circuit 100 includes an analog front-end (AFE) 110, a sampler 120, a phase detector 130 and a finite state machine (FSM) 140. The data recovery circuit 100 may further include a clock phase controller 150 and a reference voltage generator 160.

The analog front-end 110 receives an input data signal DQ, and generates a data signal DAT corresponding to the input data signal DQ based on the input data signal DQ and a reference voltage VREF. As will be described with reference to FIG. 24, the data recovery circuit 100 may be included in a receiver. The analog front-end 110 may have a configuration for receiving the input data signal DQ that is an analog signal and that is provided from a transmitter via a communication channel.

In some example embodiments, the input data signal DQ may be a single-ended signal. For example, the data recovery circuit 100 may be included in a memory system including a memory device such as a dynamic random access memory (DRAM) or a graphic double data rate six (GDDR6) DRAM, and may be used to receive data from the memory device. For example, since a GDDR6 DRAM performs a single-ended signaling, the analog front-end 110 may receive the input data signal DQ and the reference voltage VREF, and then the reference voltage VREF may be used as a voltage for calibrating an input offset.

The sampler 120 samples the input data signal DQ (e.g., samples the data signal DAT corresponding to the input data signal DQ) based on a plurality of clock signals CLK[0:7] to generate a plurality of sample data signals D[0:7]. For example, when the phase detector 130 is implemented in the form of a quarter-rate binary phase detector, the plurality of clock signals CLK[0:7] may include first through eighth clock signals CLK0, CLK1, CLK2, CLK3, CLK4, CLK5, CLK6 and CLK7, and the plurality of sample data signals D[0:7] may include first through eighth sample data signals D0, D1, D2, D3, D4, D5, D6 and D7. For example, the first sample data signal D0 may be generated by sampling the input data signal DQ (e.g., the data signal DAT corresponding to the input data signal DQ) based on the first clock signal CLK0.

As illustrated in FIG. 5, phases of the first through fourth clock signals CLK0~CLK3 may partially overlap with each other. Each of the fifth through eighth clock signals CLK4~CLK7 may have a phase opposite to that of a respective one of the first through fourth clock signals CLK0~CLK3. The phases of the fifth through eighth clock signals CLK4~CLK7 may partially overlap with each other. In addition, adjacent clock signals (e.g., the first and second clock signals CLK0 and CLK1) may have a phase difference of about ⅛ of one clock period CPER.

The phase detector 130 generates an up signal UP[0:3] including a plurality of first bits and a down signal DN[0:3] including a plurality of second bits based on the plurality of sample data signals D[0:7]. For example, when the phase detector 130 is implemented in the form of the quarter-rate binary phase detector, the up signal UP[0:3] may include four first bits that correspond to first through fourth clock signals CLK0~CLK3, and the down signal DN[0:3] may include four second bits that correspond to fifth through eighth clock signals CLK4~CLK7.

In some example embodiments, the phase detector 130 may perform an XOR operation on the plurality of sample data signals D[0:7] to generate the up signal UP[0:3] and the down signal DN[0:3]. For example, the phase detector 130 may perform the XOR operation on two adjacent sample data signals (e.g., the first and second sample data signals D0 and D1) among the plurality of sample data signals D[0:7] to generate one bit (e.g., a first up bit UP0) included in the up signal UP[0:3] and/or to generate one bit (e.g. a first down bit DN0) the down signal DN[0:3]. For example, the phase detector 130 may include at least one XOR gate.

The finite state machine 140 performs a clock phase calibration operation for adjusting phases of the plurality of clock signals CLK[0:7] based on the up signal UP[0:3] and/or the down signal DN[0:3], and performs a voltage offset calibration operation for adjusting a level of the reference voltage VREF based on the up signal UP[0:3], the down signal DN[0:3] and/or the first sample data signal D0 among the plurality of sample data signals D[0:7]. For example, the finite state machine 140 may generate a clock phase control signal CCON for performing the clock phase calibration operation (e.g., for increasing or decreasing delays of the plurality of clock signals CLK[0:7]). In addition, the finite state machine 140 may generate a voltage offset control signal VCON for performing the voltage offset calibration operation (e.g., for increasing or decreasing the voltage level of the reference voltage VREF). For example, the finite state machine 140 may be implemented in the form of a digital loop filter.

The clock phase controller 150 may generate the plurality of clock signals CLK[0:7] based on a plurality of input clock signals CLKIN[0:7], and may adjust the phases of the plurality of clock signals CLK[0:7] based on the clock phase control signal CCON. For example, when the plurality of clock signals CLK[0:7] include the first through eighth clock signals CLK0~CLK7, the plurality of input clock signals CLKIN[0:7] may also include first through eighth input clock signals.

The reference voltage generator 160 may generate the reference voltage VREF based on an external voltage (not illustrated), and may adjust the voltage level of the reference voltage VREF based on the voltage offset control signal VCON.

In some example embodiments, a clock phase calibration loop CLP for the clock phase calibration operation and a voltage offset calibration loop VLP for the voltage offset calibration operation may commonly include the phase detector 130 and the finite state machine 140. In other words, the phase detector 130 and the finite state machine 140 may be shared by the clock phase calibration loop CLP and the voltage offset calibration loop VLP. The data recovery circuit 100 may not include additional circuits and/or elements for performing the voltage offset calibration operation. No additional circuitry may be required since the truth-table is used to calibrate the input offset. Since the UP/DN values for the clock phase calibration loop CCON and the UP/DN values for the voltage offset calibration loop VCON are different from each other, the two loops do not collide with each other, thus ensuring operational stability. In this way, the clock phase calibration loop and the voltage offset calibration loop do not interfere with operations of once another.

As described above, the data recovery circuit 100 may perform the method of calibrating the clock phase and the voltage offset according to example embodiments. In some example embodiments, at least a part of the elements included in the data recovery circuit 100 may be implemented as hardware. For example, at least a part of the elements included in the data recovery circuit 100 may be included in a computer-based electronic system. In other example embodiments, at least a part of the elements included in the data recovery circuit 100 may be implemented as instruction codes or program routines (e.g., a software program). For example, the instruction codes or the program routines may be executed by a computer-based electronic system and/or one or more processors, and may be stored in any storage device located inside or outside the computer-based electronic system.

Hereinafter, detailed operations according to example embodiments will be described based on an example where the phase detector 130 is implemented in the form of the quarter-rate binary phase detector (e.g., the plurality of clock signals CLK[0:7] and the plurality of sample data signals D[0:7] include eight signals, respectively, and the up signal UP[0:3] and the down signal DN[0:3] include four bits, respectively). However, example embodiments are not limited thereto, and the configuration of the phase detector, the number of clock signals, the number of sample data signals and/or the number of bits included in the up signal and the down signal may be changed according to example embodiments.

Figure 6:
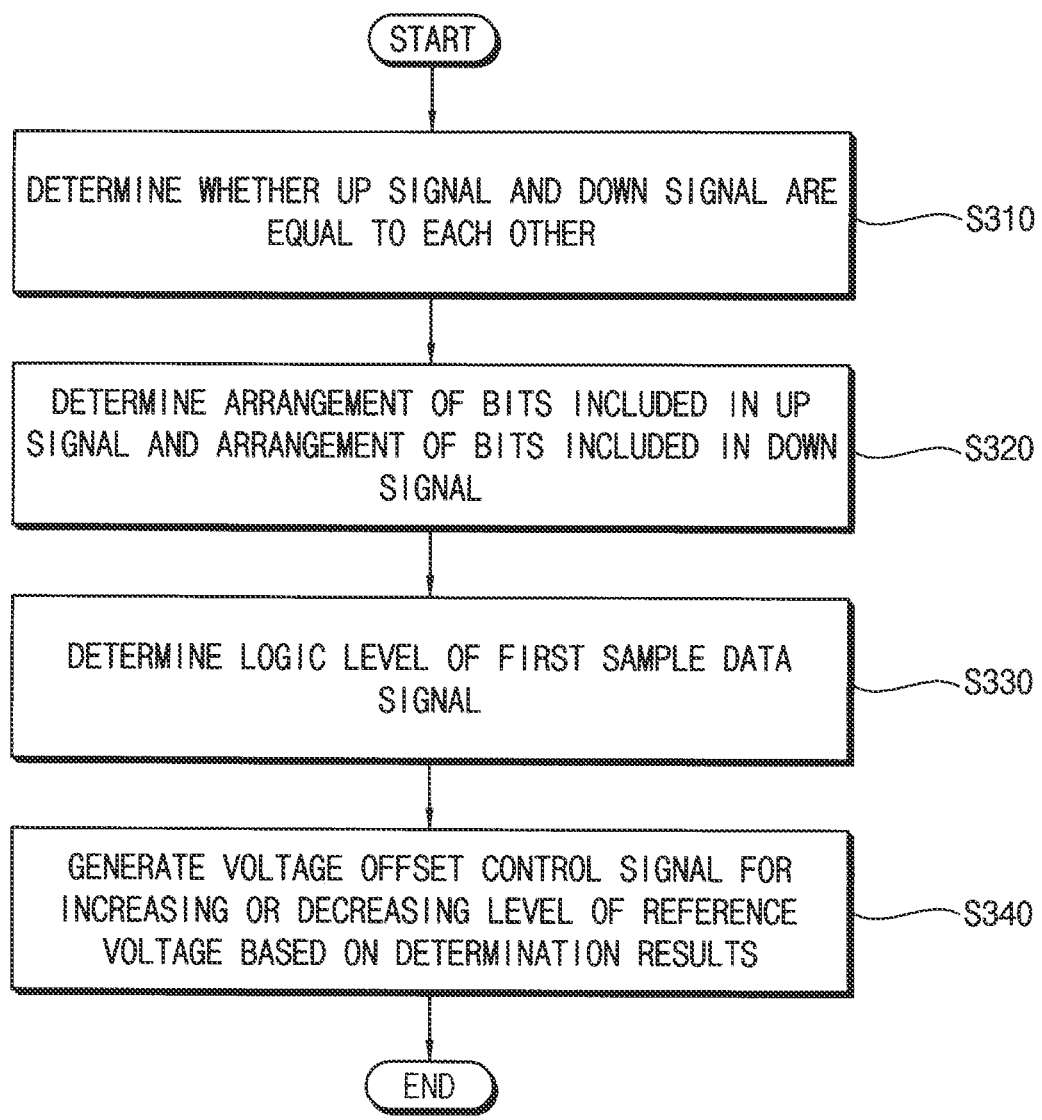
FIG. 6 is a flowchart illustrating an example of performing the voltage offset calibration operation in the method of FIG. 1, according to example embodiments.

FIG. 6 is a flowchart illustrating an example of performing the voltage offset calibration operation in the method of FIG. 1.

Referring to FIGS. 1, 4 and/or 6, when performing the voltage offset calibration operation (step S300 of FIG. 1), whether the up signal UP[0:3] and the down signal DN[0:3] are equal to each other to generate a first determination result (step S310 of FIG. 6) may be determined, an arrangement of the plurality of first bits included in the up signal UP[0:3] and an arrangement of the plurality of second bits included in the down signal DN[0:3] to generate a second determination result (step S320 of FIG. 6) may be determined, and a logic level of the first sample data signal D0 to generate a third determination result (step S330 of FIG. 3) may be determined.

The voltage offset control signal VCON for increasing or decreasing the voltage level of the reference voltage VREF may be generated based on the first, second and third determination results (step S340 of FIG. 6). As described with reference to FIG. 2, when the up signal UP[0:3] and the down signal DN[0:3] satisfy the first condition CASE1, the voltage level of the reference voltage VREF may be increased or decreased depending on the logic level of the first sample data signal D0. For example, the voltage level of the reference voltage VREF may be increased or decreased until the reference voltage VREF has an improved or optimal offset level (e.g., until the voltage level of the reference voltage VREF is at an exact middle or intermediate level between a high level and a low level of the input data signal DQ).

Figure 7:
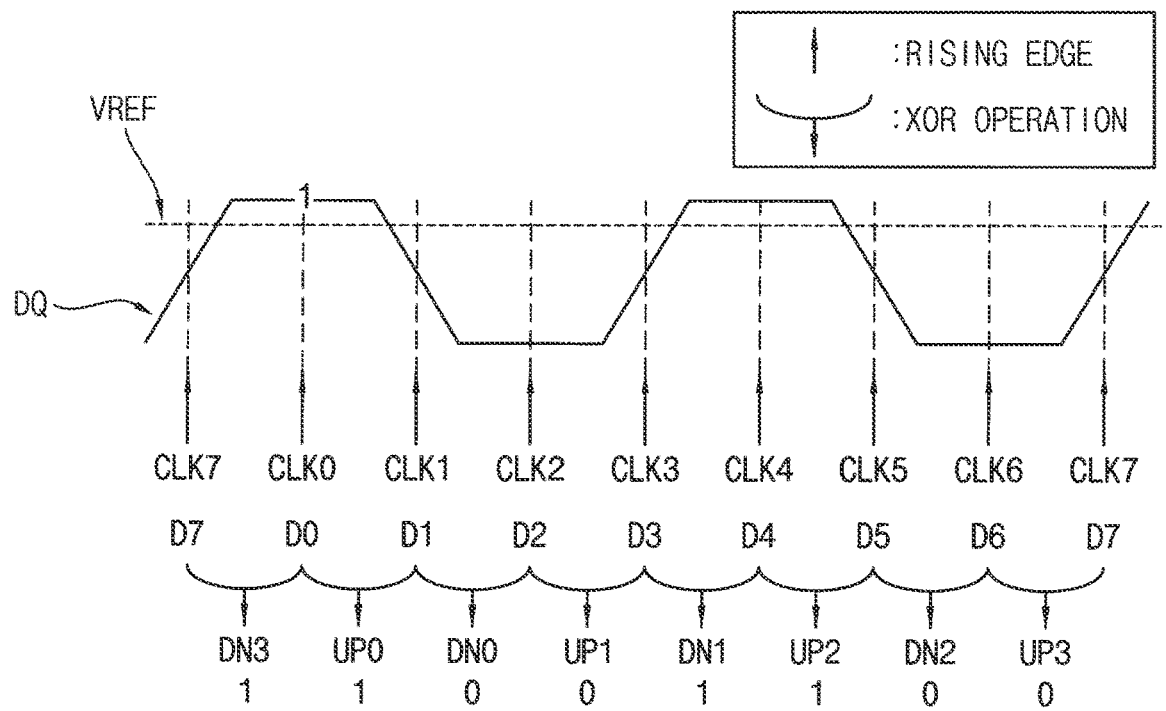
Figure 8:
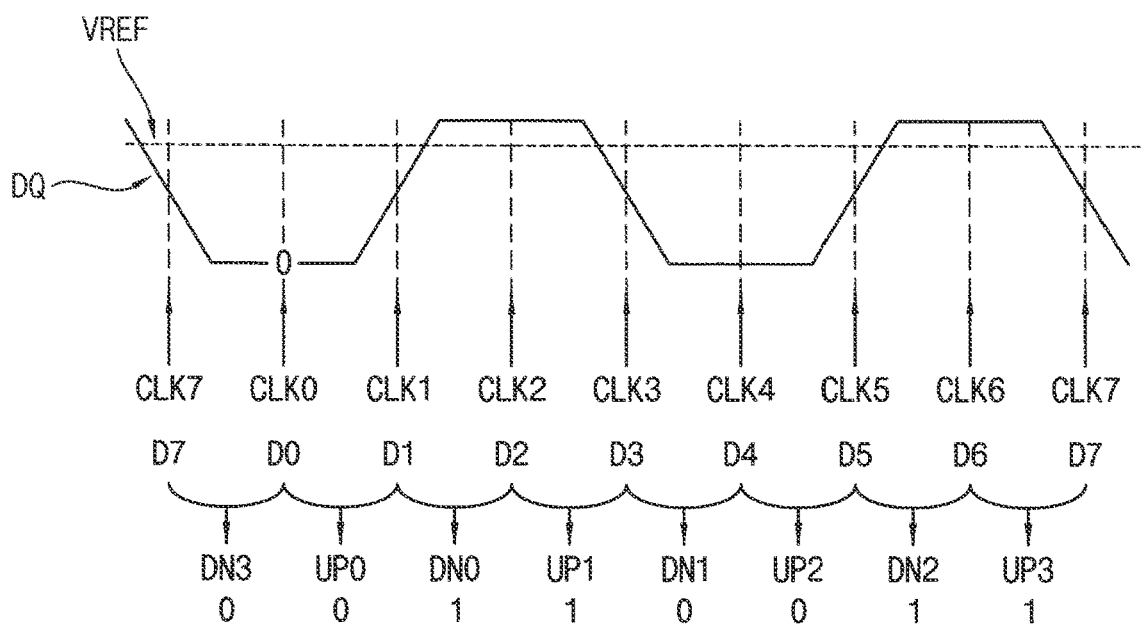
Figure 9:
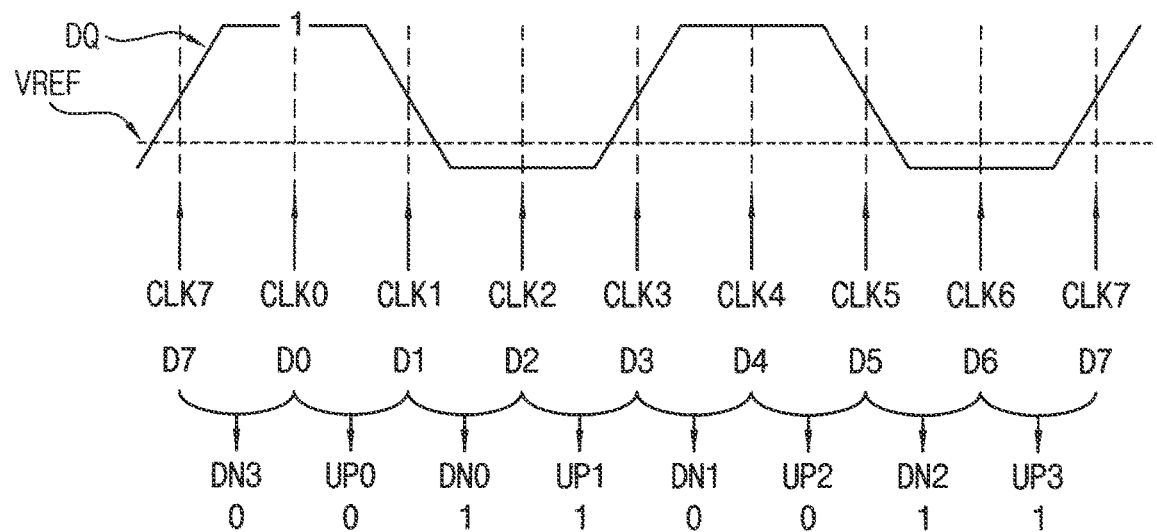
Figure 10:
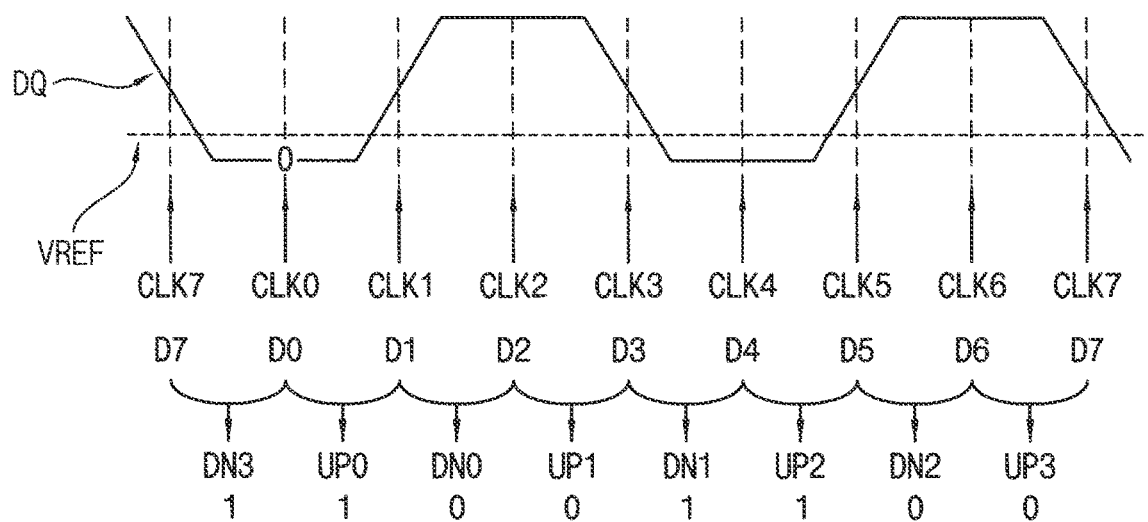
Figure 11:
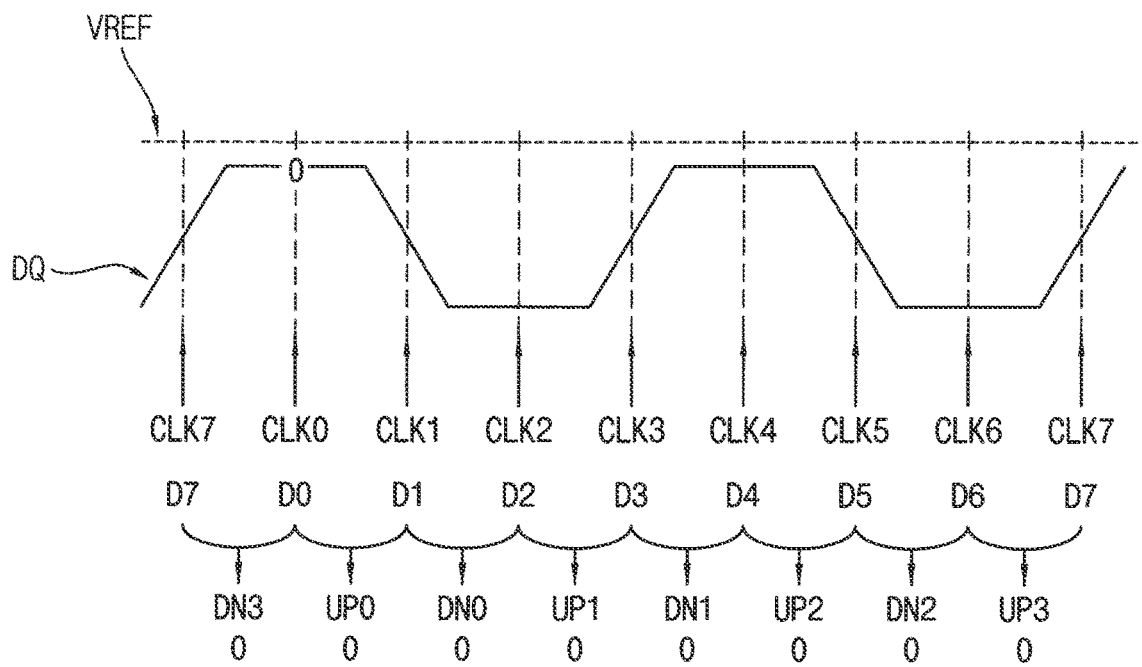
Figure 12:
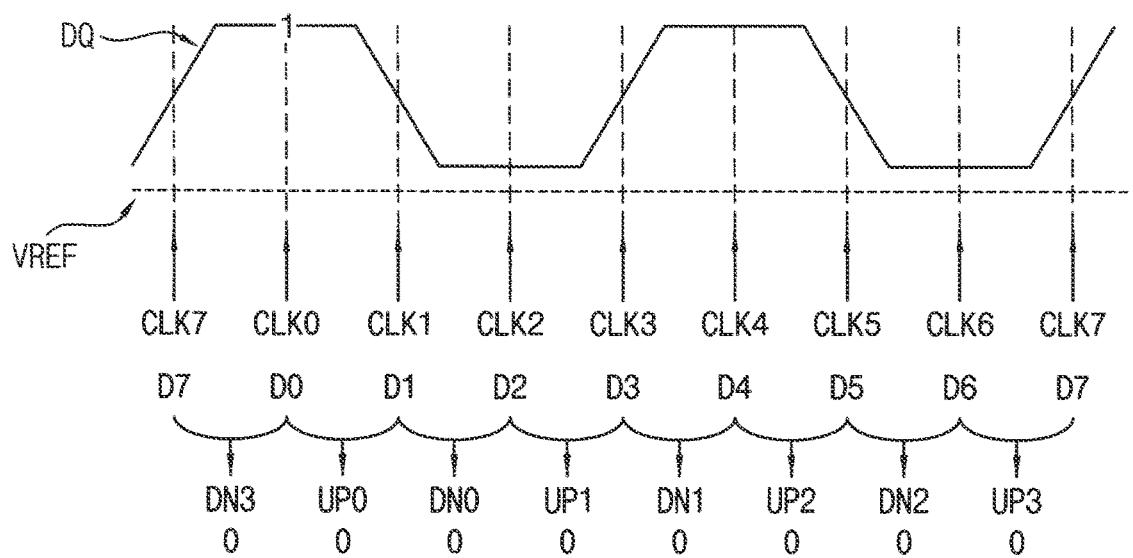

FIGS. 7, 8, 9, 10, 11 and 12 are diagrams for describing the voltage offset calibration operation of FIG. 6. FIGS. 7, 8 and 11 illustrate examples where the voltage level of the reference voltage VREF is higher than the optimum offset level. FIGS. 9, 10 and 12 illustrate examples where the voltage level of the reference voltage VREF is lower than the optimum offset level.

In FIG. 7 and following figures, an upward arrow illustrated with each clock signal indicates a rising edge of each clock signal, and a downward arrow illustrated between two adjacent sample data signals indicates an XOR operation on the adjacent sample data signals. In addition, a toggle period of the input data signal DQ may be about ½ of a clock period (e.g., the clock period CPER in FIG. 5) of each clock signal. Further, it may be assumed that a rising edge of the first clock signal CLK0 is substantially aligned with a center (or a data center) of the input data signal DQ (e.g., it may be assumed that a phase lock is exactly and correctly performed or implemented) in FIGS. 7, 8, 9, 10, 11 and 12.

Referring to FIG. 7, when the input data signal DQ and the reference voltage VREF are received as illustrated, the input data signal DQ may have a voltage level higher than that of the reference voltage VREF at the rising edge of the first clock signal CLK0, and thus the first sample data signal D0 that is generated by sampling the input data signal DQ based on the first clock signal CLK0 may have a first logic level '1'. The input data signal DQ may have a voltage level lower than that of the reference voltage VREF at a rising edge of the second clock signal CLK1, and thus the second sample data signal D1 that is generated by sampling the input data signal DQ based on the second clock signal CLK1 may have a second logic level '0' that is different from the first logic level '1'. Similarly, the third sample data signal D2, the fourth sample data signal D3, the fifth sample data signal D4, the sixth sample data signal D5, the seventh sample data signal D6 and the eighth sample data signal D7 that are generated by sampling the input data signal DQ based on the third clock signal CLK2, the fourth clock signal CLK3, the fifth clock signal CLK4, the sixth clock signal CLK5, the seventh clock signal CLK6 and the eighth clock signal CLK7, respectively, may have the second logic level '0', the second logic level '0', the first logic level '1', the second logic level '0', the second logic level '0' and the second logic level '0', respectively.

In addition, the one bit UP0 of the up signal UP[0:3] may be generated by performing the XOR operation on the first and second sample data signals D0 and D1. Similarly, bits UP1, UP2 and UP3 of the up signal UP[0:3] other than the bit UP0 may be generated by performing the XOR operation on the third and fourth sample data signals D2 and D3, the XOR operation on the fifth and sixth sample data signals D4 and D5, and the XOR operation on the seventh and eighth sample data signals D6 and D7, respectively. Bits DN0, DN1, DN2 and DN3 of the down signal DN[0:3] may be generated by performing the XOR operation on the second and third sample data signals D1 and D2, the XOR operation on the fourth and fifth sample data signals D3 and D4, the XOR operation on the sixth and seventh sample data signals D5 and D6, and the XOR operation on the eighth and first sample data signals D7 and D0, respectively.

Therefore, when the up signal UP[0:3] has a value of '1010', when the down signal DN[0:3] has a value of '0101', and when the first sample data signal D0 has the first logic level '1', it may be determined that the voltage level of the reference voltage VREF is higher than the optimum offset level, and thus the voltage offset control signal VCON may be generated to decrease the voltage level of the reference voltage VREF.

In other words, as illustrated in FIG. 7, when the up signal UP[0:3] and the down signal DN[0:3] are different from each other, when the up signal UP[0:3] has a first value '1010' in which a first bit value '1' and a second bit value '0' that are different from each other are alternately repeated in a first arrangement, when the down signal DN[0:3] has a second value '0101' in which the first bit value '1' and the second bit value '0' are alternately repeated in a second arrangement that is different from the first arrangement, and when the first sample data signal D0 has the first logic level '1', the voltage offset control signal VCON for decreasing the voltage level of the reference voltage VREF may be generated.

Referring to FIG. 8, when the input data signal DQ and the reference voltage VREF are received as illustrated, the first sample data signal D0 may have the second logic level '0' by performing the sampling operation described with reference to FIG. 7. Similarly, the second sample data signal D1, the third sample data signal D2, the fourth sample data signal D3, the fifth sample data signal D4, the sixth sample data signal D5, the seventh sample data signal D6 and the eighth sample data signal D7 may have the second logic level '0', the first logic level '1', the second logic level '0', the second logic level '0', the second logic level '0', the first logic level '1' and the second logic level '0', respectively. In addition, the bits UP0, UP1, UP2 and UP3 of the up signal UP[0:3] and the bits DN0, DN1, DN2 and DN3 of the down signal DN[0:3] may be generated by performing the XOR operation on adjacent sample data signals described with reference to FIG. 7.

Therefore, when the up signal UP[0:3] has a value of '0101', when the down signal DN[0:3] has a value of '1010', and when the first sample data signal D0 has the second logic level '0', it may be determined that the voltage level of the reference voltage VREF is higher than the optimum offset level, and thus the voltage offset control signal VCON may be generated to decrease the voltage level of the reference voltage VREF.

In other words, as illustrated in FIG. 8, when the up signal UP[0:3] and the down signal DN[0:3] are different from each other, when the up signal UP[0:3] has the second value '0101', when the down signal DN[0:3] has the first value '1010', and when the first sample data signal D0 has the second logic level '0', the voltage offset control signal VCON for decreasing the voltage level of the reference voltage VREF may be generated.

In some example embodiments, a unit for increasing or decreasing the voltage level of the reference voltage VREF at one time may be smaller than a difference between the high level and the low level of the input data signal DQ, and the unit may be changed as described with reference to FIGS. 23H and 23I.

Referring to FIG. 9, when the input data signal DQ and the reference voltage VREF are received as illustrated, the up signal UP[0:3] having a value of '0101', the down signal DN[0:3] having a value of '1010' and the first sample data signal D0 having the first logic level '1' may be obtained by sequentially performing the sampling operation and the XOR operation described with reference to FIGS. 7 and 8. In this example, it may be determined that the voltage level of the reference voltage VREF is lower than the optimum offset level, and thus the voltage offset control signal VCON may be generated to increase the voltage level of the reference voltage VREF.

In other words, as illustrated in FIG. 9, when the up signal UP[0:3] and the down signal DN[0:3] are different from each other, when the up signal UP[0:3] has the second value '0101', when the down signal DN[0:3] has the first value '1010', and when the first sample data signal D0 has the first logic level '1', the voltage offset control signal VCON for increasing the voltage level of the reference voltage VREF may be generated.

Referring to FIG. 10, when the input data signal DQ and the reference voltage VREF are received as illustrated, the up signal UP[0:3] having a value of '1010', the down signal DN[0:3] having a value of '0101' and the first sample data signal D0 having the second logic level '0' may be obtained by sequentially performing the sampling operation and the XOR operation described with reference to FIGS. 7 and 8. In this example, it may be determined that the voltage level of the reference voltage VREF is lower than the optimum offset level, and thus the voltage offset control signal VCON may be generated to increase the voltage level of the reference voltage VREF.

In other words, as illustrated in FIG. 10, when the up signal UP[0:3] and the down signal DN[0:3] are different from each other, when the up signal UP[0:3] has the first value '1010', when the down signal DN[0:3] has the second value '0101', and when the first sample data signal D0 has the second logic level '0', the voltage offset control signal VCON for increasing the voltage level of the reference voltage VREF may be generated.

FIGS. 7, 8, 9 and 10 illustrate examples where the voltage level of the reference voltage VREF is within a range between the high level and the low level of the input data signal DQ. However, it may be difficult to ensure that an initial voltage level of the reference voltage VREF is within the above-described range, and thus it may be necessary to perform the voltage offset calibration operation even when the voltage level of the reference voltage VREF is sufficiently high and low.

Referring to FIG. 11, an example where the voltage level of the reference voltage VREF is sufficiently high, e.g., where the voltage level of the reference voltage VREF is higher than the high level of the input data signal DQ is illustrated. For example, the voltage level of the reference voltage VREF may be a voltage level of a power supply voltage (e.g., a VDDQ level). Although the high level of the input data signal DQ at the transmitting end may be equal to the VDDQ level, the high level of the input data signal DQ at the receiving end may be lower than the VDDQ level due to loss in transmission (e.g., frequency-dependent loss in the channel), and thus the voltage level of the reference voltage VREF may be sequentially decreased to achieve the optimum offset level.

For example, the up signal UP[0:3] having a value of '0000', the down signal DN[0:3] having a value of '0000' and the first sample data signal D0 having the second logic level '0' may be obtained by sequentially performing the sampling operation and the XOR operation. In this example, it may be determined that the voltage level of the reference voltage VREF is higher than the optimum offset level, and thus the voltage offset control signal VCON may be generated to decrease the voltage level of the reference voltage VREF.

In other words, as illustrated in FIG. 11, when the up signal UP[0:3] and the down signal DN[0:3] are equal to each other, when each of the up signal UP[0:3] and the down signal DN[0:3] has a third value '0000' in which only the second bit value '0' is repeated, and when the first sample data signal D0 has the second logic level '0', the voltage offset control signal VCON for decreasing the voltage level of the reference voltage VREF may be generated.

Referring to FIG. 12, an example where the voltage level of the reference voltage VREF is sufficiently low, e.g., where the voltage level of the reference voltage VREF is lower than the low level of the input data signal DQ is illustrated. For example, the voltage level of the reference voltage VREF may be a voltage level of a ground voltage (e.g., a VSSQ level), and thus the voltage level of the reference voltage VREF may be sequentially increased to achieve the optimum offset level.

For example, the up signal UP[0:3] having a value of '0000', the down signal DN[0:3] having a value of '0000' and the first sample data signal D0 having the first logic level '1' may be obtained by sequentially performing the sampling operation and the XOR operation. In this example, it may be determined that the voltage level of the reference voltage VREF is lower than the optimum offset level, and thus the voltage offset control signal VCON may be generated to increase the voltage level of the reference voltage VREF.

In other words, as illustrated in FIG. 12, when the up signal UP[0:3] and the down signal DN[0:3] are equal to each other, when each of the up signal UP[0:3] and the down signal DN[0:3] has the third value '0000', and when the first sample data signal D0 has the first logic level '1', the voltage offset control signal VCON for increasing the voltage level of the reference voltage VREF may be generated.

In some example embodiments, a calibration algorithm may be implemented to include one of the example of FIG. 11 and the example of FIG. 12. If the calibration algorithm is implemented to include both the example of FIG. 11 and the example of FIG. 12, the voltage level of the reference voltage VREF may be changed again, which may not be appropriate, when the toggling of the input data signal DQ ends after the voltage level of the reference voltage VREF is set to the optimum offset level (e.g., in an on-die termination (ODT) state). For example, when the data recovery circuit 100 is included in a memory system including a GDDR6 DRAM, the calibration algorithm may be implemented so as not to reflect the example of FIG. 12 in a case of using a VDDQ termination, and the calibration algorithm may be implemented so as not to reflect the example of FIG. 11 in a case of using a VSSQ termination.

Referring to FIG. 13, a voltage offset calibration algorithm that includes the examples of FIGS. 7, 8, 9, 10 and 11 and does not include the example of FIG. 12 is summarized in one table. CASE1-1, CASE1-2, CASE1-3, CASE1-4 and CASE1-5 in FIG. 13 may correspond to the example of FIG. 7, the example of FIG. 8, the example of FIG. 11, the example of FIG. 9 and the example of FIG. 10, respectively. The voltage offset calibration operation may be efficiently implemented without additional circuits and/or elements by adding the truth table illustrated in FIG. 13 to the finite state machine 140 in FIG. 4.

Figure 14:
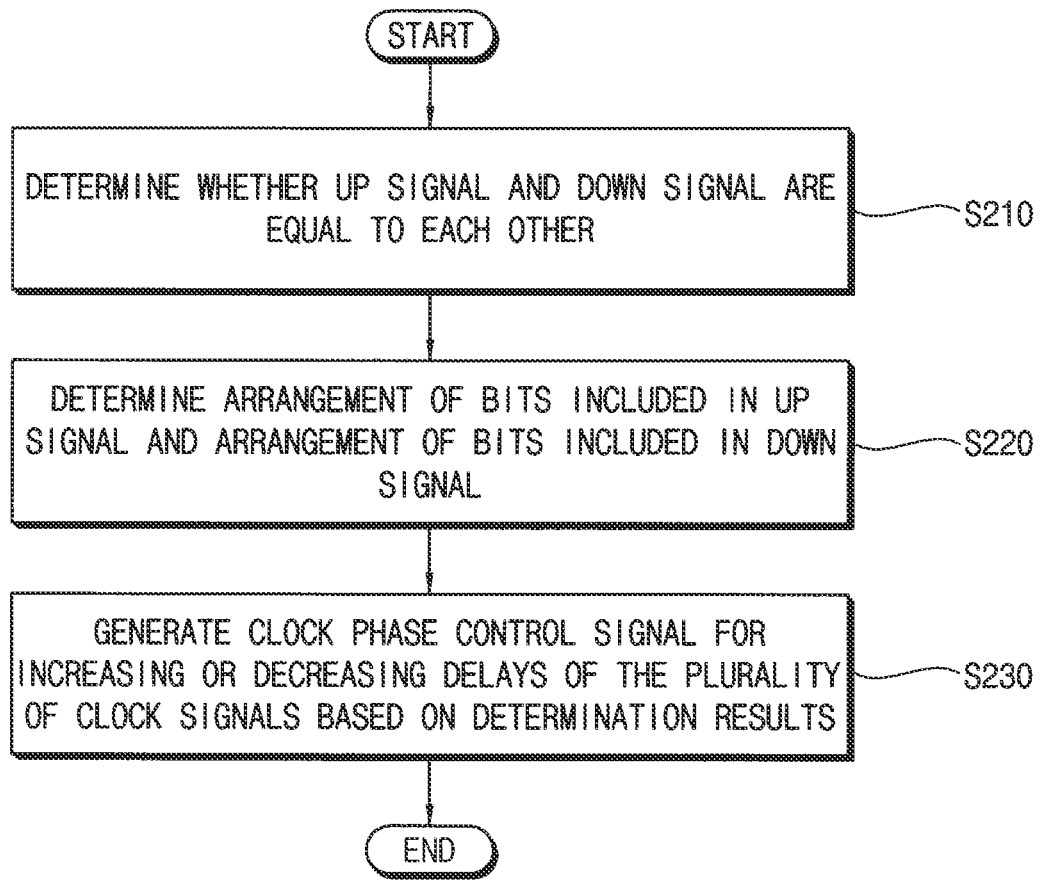
FIG. 14 is a flowchart illustrating an example of performing the clock phase calibration operation in the method of FIG. 1, according to some embodiments.

FIG. 14 is a flowchart illustrating an example of performing the clock phase calibration operation in the method of FIG. 1.

Referring to FIGS. 1, 4 and/or 14, when performing the clock phase calibration operation (step S200 of FIG. 1), whether the up signal UP[0:3] and the down signal DN[0:3] are equal to each other to generate a first determination result (step S210 of FIG. 14) may be determined, and the arrangement of the plurality of first bits included in the up signal UP[0:3] and the arrangement of the plurality of second bits included in the down signal DN[0:3] to generate a second determination result (step S220 of FIG. 14) may be determined.

The clock phase control signal CCON for increasing or decreasing delays of the plurality of clock signals CLK[0:7] based on the first and second determination results (step S230 of FIG. 14) may be determined. As described with reference to FIG. 2, when the up signal UP[0:3] and the down signal DN[0:3] satisfy the second condition CASE2, the delays of the plurality of clock signals CLK[0:7] may be increased or decreased. For example, the delays of the plurality of clock signals CLK[0:7] may be increased or decreased until each of the plurality of clock signals CLK[0:7] has an improved or optimal phase (e.g., until the rising edge of the first clock signal CLK0 is substantially aligned with the center of the input data signal DQ).

FIGS. 15, 16, 17, 18, 19, 20 and 21 are diagrams for describing the clock phase calibration operation of FIG. 14. The descriptions repeated with FIGS. 7, 8, 9, 10, 11 and 12 will be omitted.

Figure 15:
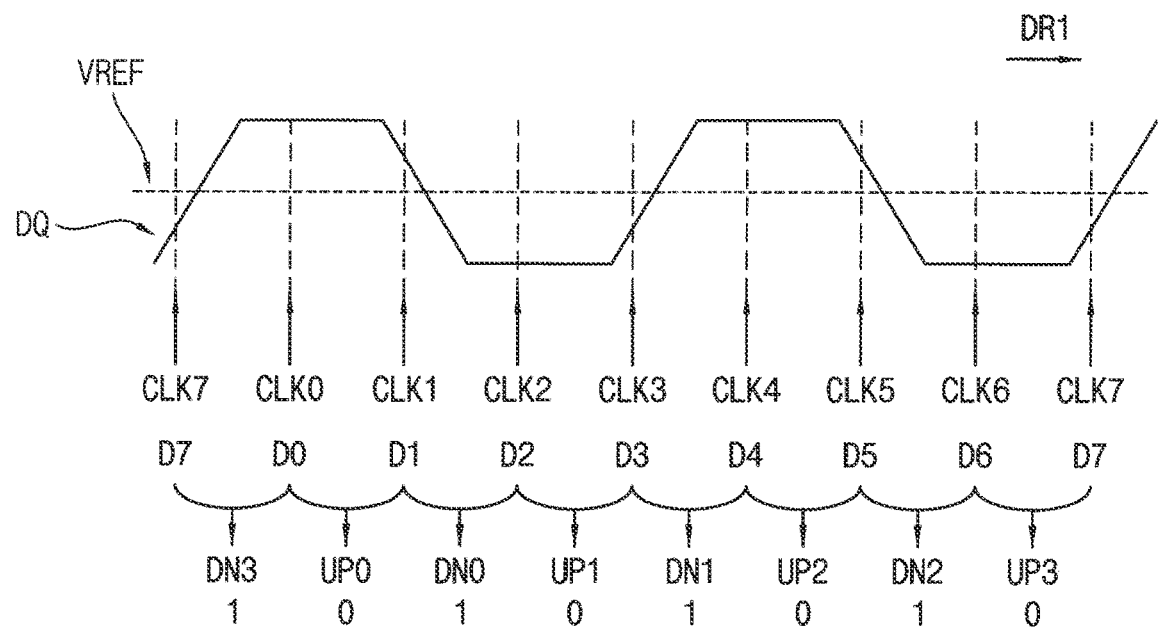
Figure 16:
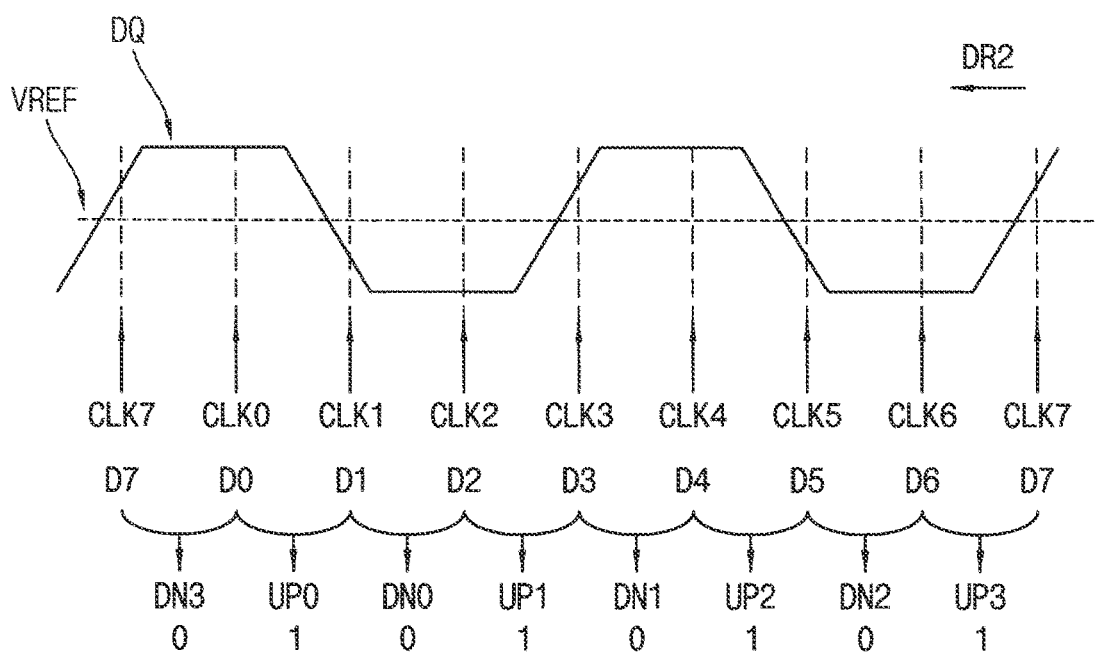

It may be assumed that the reference voltage VREF has the optimum offset level in FIGS. 15 and 16. It may be assumed that the voltage level of the reference voltage VREF is higher than the optimum offset level in FIGS. 17 and 19. It may be assumed that the voltage level of the reference voltage VREF is lower than the optimum offset level in FIGS. 18 and 20.

Referring to FIG. 15, when the input data signal DQ and the reference voltage VREF are received as illustrated, the up signal UP[0:3] having a value of '0000' and the down signal DN[0:3] having a value of '1111' may be obtained by sequentially performing the sampling operation and the XOR operation. In this example, it may be determined that the phases of the plurality of clock signals CLK[0:7] lead the center of the input data signal DQ (e.g., it may be determined that the rising edge of the first clock signal CLK0 leads or is ahead of the data center), and thus the clock phase control signal CCON may be generated to increase the delays of the plurality of clock signals CLK[0:7].

In other words, as illustrated in FIG. 15, when the up signal UP[0:3] and the down signal DN[0:3] are different from each other, and when the number of the first bit values '1' included in the down signal DN[0:3] is greater than the number of the first bit values '1' included in the up signal UP[0:3], the clock phase control signal CCON for increasing the delays of the plurality of clock signals CLK[0:7] may be generated. For example, increasing the delay of the plurality of clock signals CLK[0:7] may represent pushing back the phases of the plurality of clock signals CLK[0:7] (e.g., shifting the plurality of clock signals CLK[0:7] in a first direction DR1).

Referring to FIG. 16, when the input data signal DQ and the reference voltage VREF are received as illustrated, the up signal UP[0:3] having a value of '1111' and the down signal DN[0:3] having a value of '0000' may be obtained by sequentially performing the sampling operation and the XOR operation. In this example, it may be determined that the phases of the plurality of clock signals CLK[0:7] lag the center of the input data signal DQ (e.g., it may be determined that the rising edge of the first clock signal CLK0 lags or is later than the data center), and thus the clock phase control signal CCON may be generated to decrease the delays of the plurality of clock signals CLK[0:7].

In other words, as illustrated in FIG. 16, when the up signal UP[0:3] and the down signal DN[0:3] are different from each other, and when the number of the first bit values '1' included in the up signal UP[0:3] is greater than the number of the first bit values '1' included in the down signal DN[0:3], the clock phase control signal CCON for decreasing the delays of the plurality of clock signals CLK[0:7] may be generated. For example, decreasing the delay of the plurality of clock signals CLK[0:7] may represent pulling forward the phases of the plurality of clock signals CLK[0:7] (e.g., shifting the plurality of clock signals CLK[0:7] in a second direction DR2 opposite to the first direction DR1).

In some example embodiments, a unit for increasing or decreasing the delays of the plurality of clock signals CLK[0:7] at one time may be smaller or less than a period of each clock signal and a period of the input data signal DQ, and the unit may be changed as described with reference to FIGS. 23F and 23G.

Figure 17:
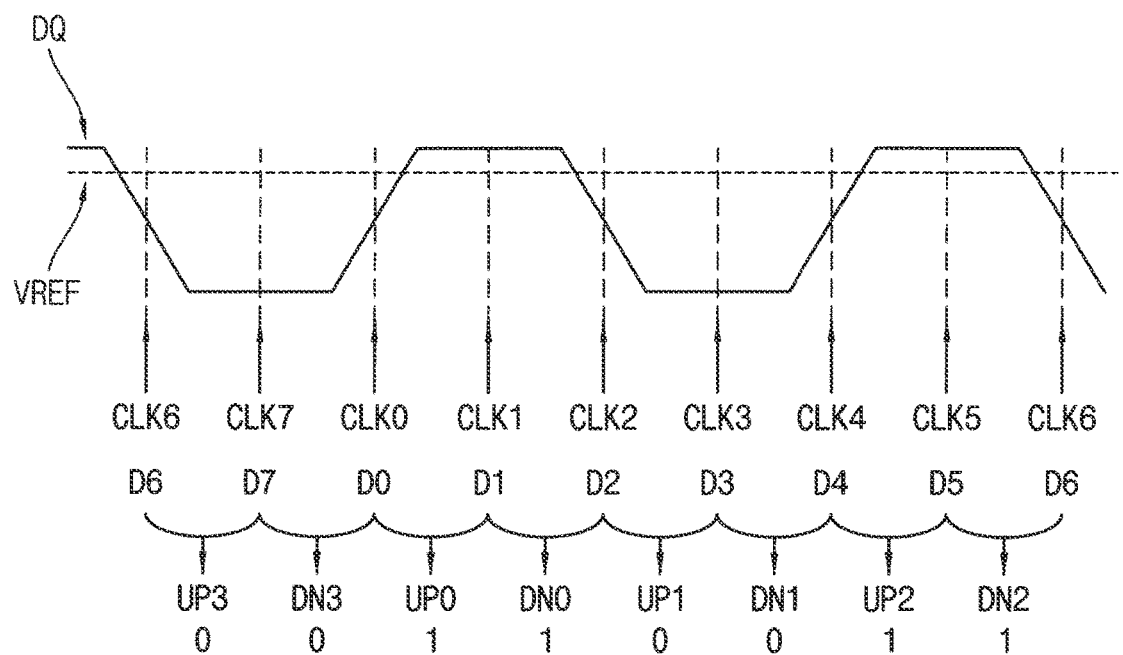
Figure 18:
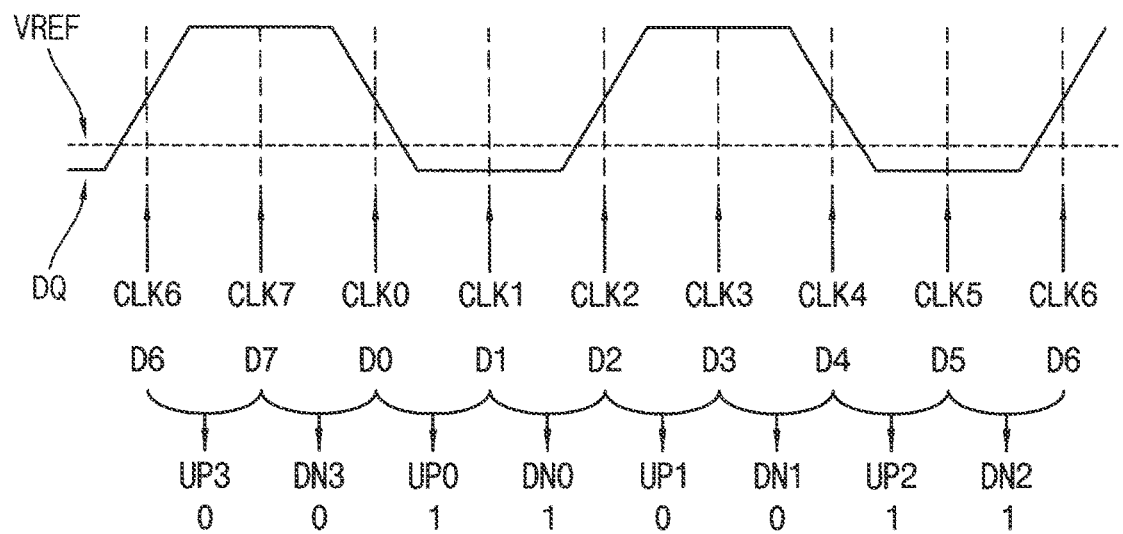

Referring to FIGS. 17 and 18, when the input data signal DQ and the reference voltage VREF are received as illustrated, the up signal UP[0:3] having a value of '1010' and the down signal DN[0:3] having a value of '1010' may be obtained by sequentially performing the sampling operation and the XOR operation. In a conventional technique, the clock phase may not be adjusted in examples of FIGS. 17 and 18 because the up signal UP[0:3] and the down signal DN[0:3] have the same value, and because the number of the first bit values '1' included in the up signal UP[0:3] and the number of the first bit values '1' included in the down signal DN[0:3] are equal to each other. However, in the method of calibrating the clock phase and the voltage offset according to example embodiments, examples of FIGS. 17 and 18 may be reflected in the calibration algorithm to pull forward the phases of the plurality of clock signals CLK[0:7] because the clock phase calibration operation and the voltage offset calibration operation are performed together using the up signal UP[0:3] and down signal DN[0:3], and because the up signal UP[0:3] and the down signal DN[0:3] may have the value of '1010' even if the rising edge of the first clock signal CLK0 is at an edge of the input data signal DQ when the voltage level of the reference voltage VREF is slightly lower than the high level of the input data signal DQ as illustrated in FIG. 17 or when the voltage level of the reference voltage VREF is slightly higher than the low level of the input data signal DQ as illustrated in FIG. 18.

In other words, as illustrated in FIGS. 17 and 18, when the up signal UP[0:3] and the down signal DN[0:3] are equal to each other, and when each of the up signal UP[0:3] and the down signal DN[0:3] has the first value '1010' in which the first bit value '1' and the second bit value '0' are alternately repeated in the first arrangement, the clock phase control signal CCON for decreasing the delays of the plurality of clock signals CLK[0:7] may be generated.

Figure 19:
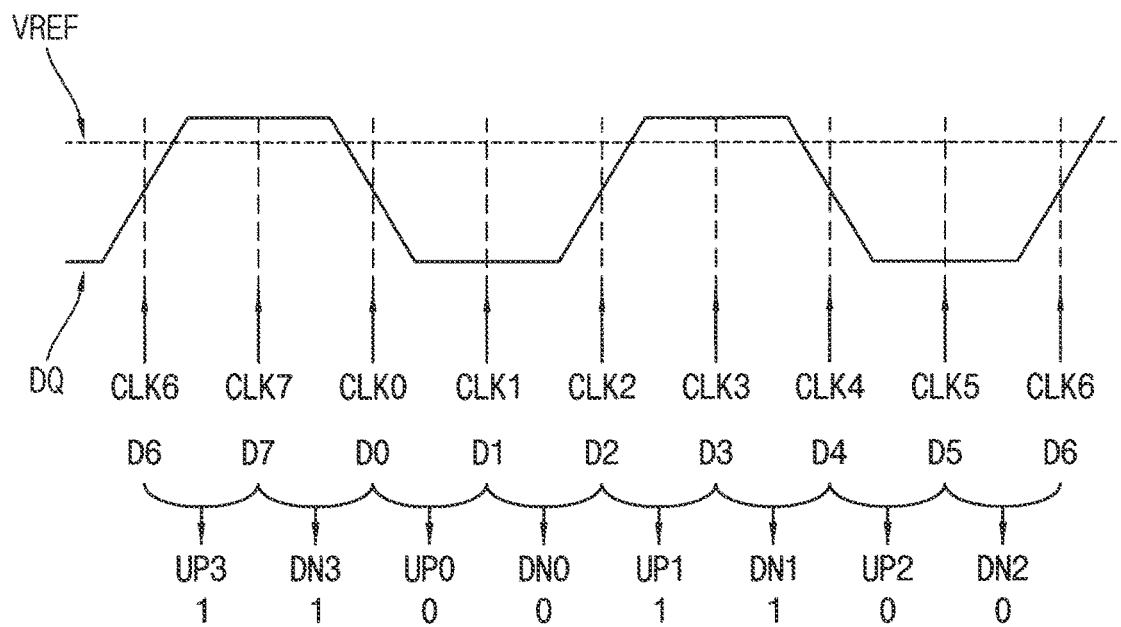
Figure 20:
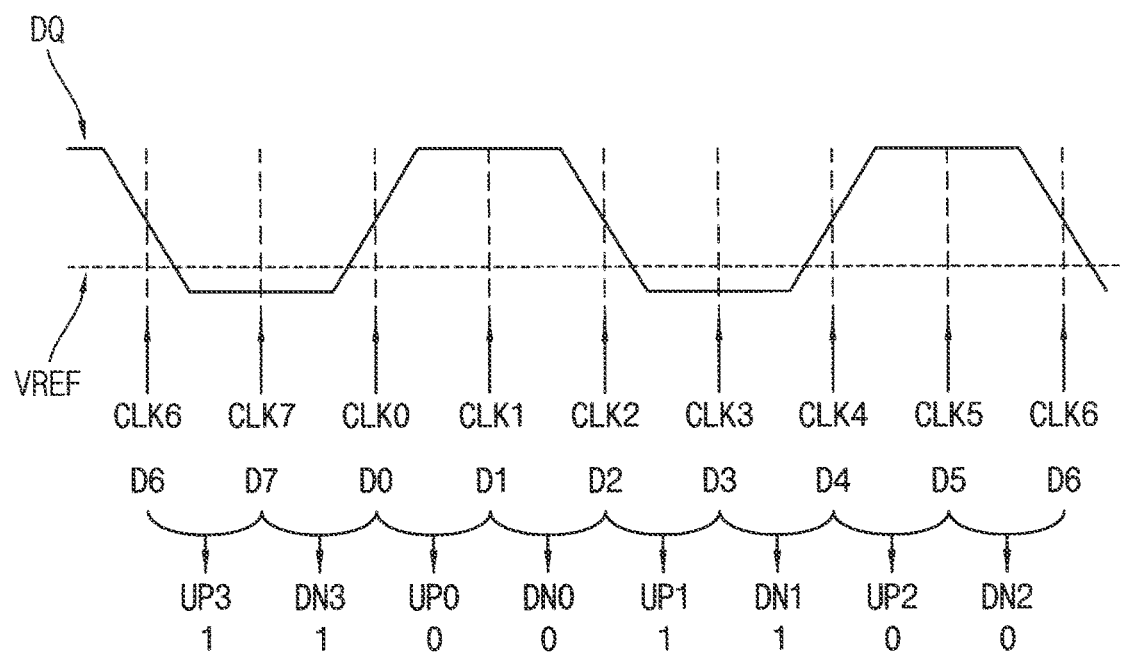

Referring to FIGS. 19 and 20, when the input data signal DQ and the reference voltage VREF are received as illustrated, the up signal UP[0:3] having a value of '0101' and the down signal DN[0:3] having a value of '0101' may be obtained by sequentially performing the sampling operation and the XOR operation. Similar to that described with reference to FIGS. 17 and 18, in a conventional technique, the clock phase may not be adjusted in examples of FIGS. 19 and 20. However, in the method of calibrating the clock phase and the voltage offset according to example embodiments, examples of FIGS. 19 and 20 may be reflected in the calibration algorithm to pull forward the phases of the plurality of clock signals CLK[0:7].

In other words, as illustrated in FIGS. 19 and 20, when the up signal UP[0:3] and the down signal DN[0:3] are equal to each other, and when each of the up signal UP[0:3] and the down signal DN[0:3] has the second value '0101' in which the first bit value '1' and the second bit value '0' are alternately repeated in the second arrangement, the clock phase control signal CCON for decreasing the delays of the plurality of clock signals CLK[0:7] may be generated.

Examples where the up signal UP[0:3] and the down signal DN[0:3] are equal to each other as the first value '1010' or the second value '0101' may not occur in cases other than the examples of FIGS. 17, 18, 19 and 20. In other words, the bit UP0 of the up signal UP[0:3] and the bit DN0 of the down signal DN[0:3] may be determined based on whether the values of the first and third sample data signals D0 and D2 are equal to or different from each other with respect to the value of the second sample data signal D1. When the rising edge of the second clock signal CLK1 is near the edge of the input data signal DQ, the values of the first and third sample data signals D0 and D2 should be different from each other as illustrated in FIGS. 7 and 8, and thus the bit UP0 of the up signal UP[0:3] and the bit DN0 of the down signal DN[0:3] may be different from each other. However, when the rising edge of the second clock signal CLK1 is near the center of the input data signal DQ, the values of the first and third sample data signals D0 and D2 may be equal to each other as illustrated in FIGS. 17 and 19, and thus the bit UP0 of the up signal UP[0:3] and the bit DN0 of the down signal DN[0:3] may be equal to each other.

Referring to FIG. 21, a clock phase calibration algorithm that includes the examples of FIGS. 15, 16, 17, 18, 19 and 20 is summarized in one table. CASE2-1 and CASE2-2 in FIG. 21 may correspond to the example of FIG. 15 and the example of FIG. 16, respectively. The notation of UP<DN in CASE2-1 does not mean that the value of the down signal DN[0:3] is greater than that of the up signal UP[0:3], and indicates that the number of the first bit values '1' included in the down signal DN[0:3] is greater than the number of the first bit values '1' included in the up signal UP[0:3]. Similarly, the notation of UP>DN in CASE2-2 indicates that the number of the first bit values '1' included in the up signal UP[0:3] is greater than the number of the first bit values '1' included in the down signal DN[0:3]. In addition, CASE2-3 in FIG. 21 may correspond to the examples of FIGS. 17 and 18, and CASE2-4 in FIG. 21 may correspond to the examples of FIGS. 19 and 20. The clock phase calibration operation may be efficiently implemented by adding the truth table illustrated in FIG. 21 to the finite state machine 140 in FIG. 4.

FIGS. 22A, 22B, 22C and 22D are diagrams illustrating examples of a method of calibrating a clock phase and a voltage offset according to example embodiments. FIGS. 22A, 22B, 22C and 22D illustrate examples where the voltage level of the reference voltage VREF is adjusted.

In FIGS. 22A, 22B, 22C and 22D, DQ indicates an input data signal received by a data recovery circuit, and DQ' indicates a data signal at a transmitting end corresponding to the input data signal. The input data signal may have an ODT state and a VDDQ level in a LDFF period, and may have a pattern of '0101' in a RDTR period. The input data signal may be a toggled signal and a fast signal of about 16 Gb/s, and thus a swing level of the input data signal may be reduced by, e.g., a frequency-dependent loss of a channel. It may be assumed that the plurality of clock signals are data/edge aligned. For convenience of illustration, CLK0, CLK1, CLK2, CLk3, CLK4, CLK5, CLK6 and CLK7, which indicate the plurality of clock signals, are briefly denoted as 0, 1, 2, 3, 4, 5, 6 and 7, respectively.

Figure 22A:
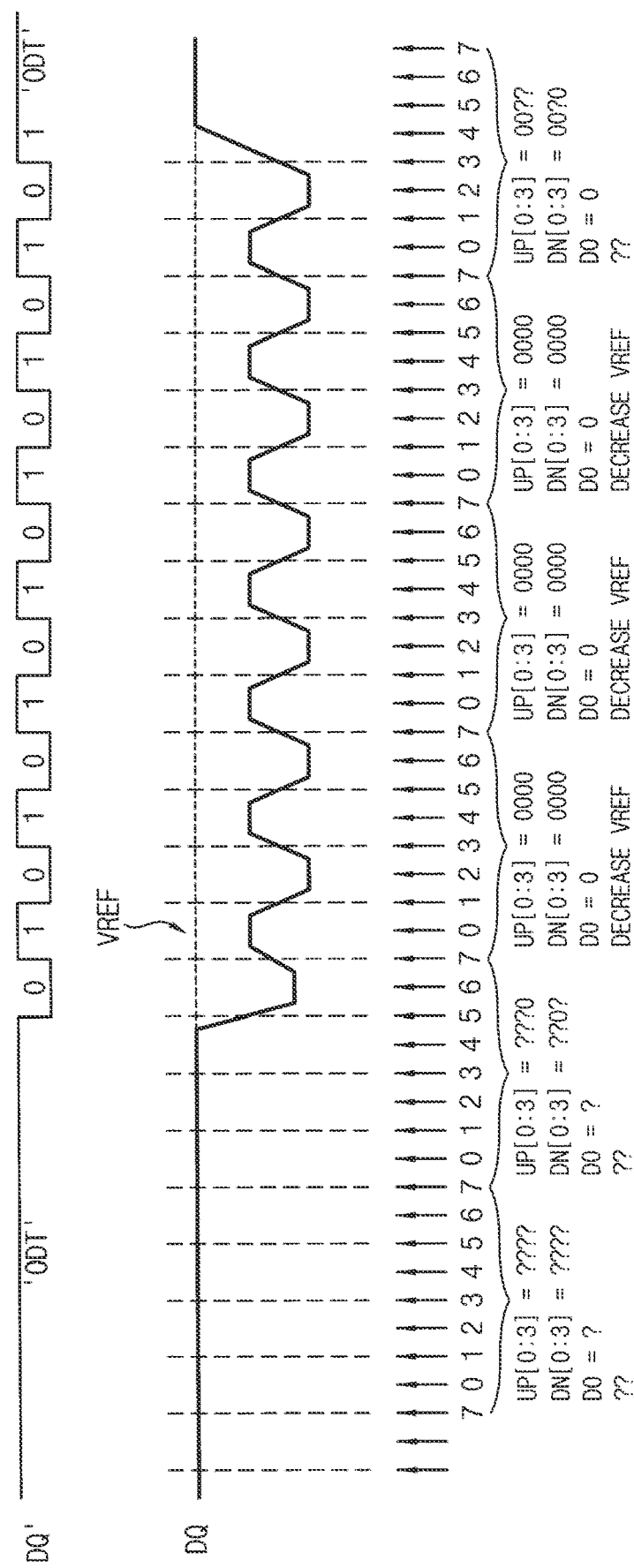
FIGS. 22A, 22B, 22C and 22D are diagrams illustrating examples of a method of calibrating a clock phase and a voltage offset, according to example embodiments.

Referring to FIG. 22A, an example where an initial value of the reference voltage VREF has the highest level (e.g., the VDDQ level) is illustrated. When the input data signal DQ is in the ODT state, the input data signal DQ and the reference voltage VREF may become equal to each other, and thus values of the first sample data signal D0, the up signal UP[0:3] and the down signal DN[0:3] may become unknown values. Assuming that the unknown value corresponds to any one of CASE1-1, CASE1-2, CASE1-3, CASE1-4 and CASE1-5 in FIG. 13, if it is determined that the reference voltage VREF needs to be increased, the reference voltage VREF is already at the highest level and no longer changes. If it is determined that the reference voltage VREF needs to be decreased, then this may be an appropriate change. When the input data signal DQ has a pattern of '0101', it may be determined that the reference voltage VREF should be decreased in correspondence with CASE1-3 in FIG. 13.

Figure 22B:
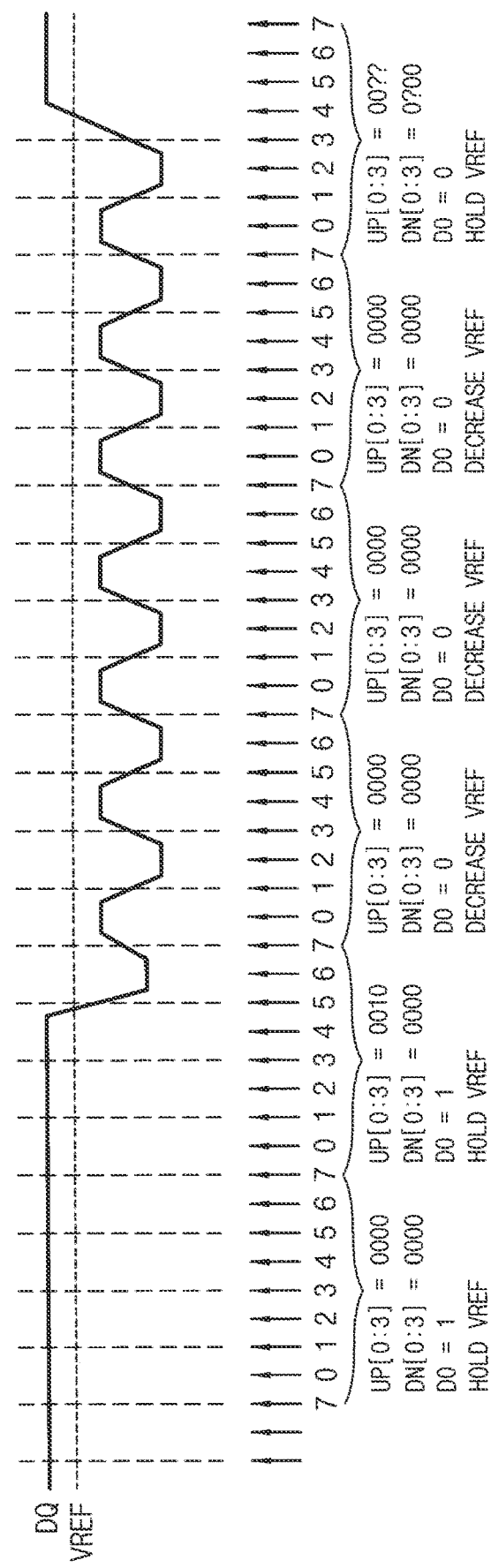

Referring to FIG. 22B, an example where the reference voltage VREF is slightly decreased compared with the example of FIG. 22A is illustrated. When the input data signal DQ is in the ODT state, the input data signal DQ may have a higher value than the reference voltage VREF, and thus the reference voltage VREF may not be changed because the voltage offset calibration algorithm is implemented not to reflect the example of FIG. 12. When the input data signal DQ has a pattern of '0101', it may be determined that the reference voltage VREF should still be decreased in correspondence with CASE1-3 in FIG. 13.

Figure 22C:
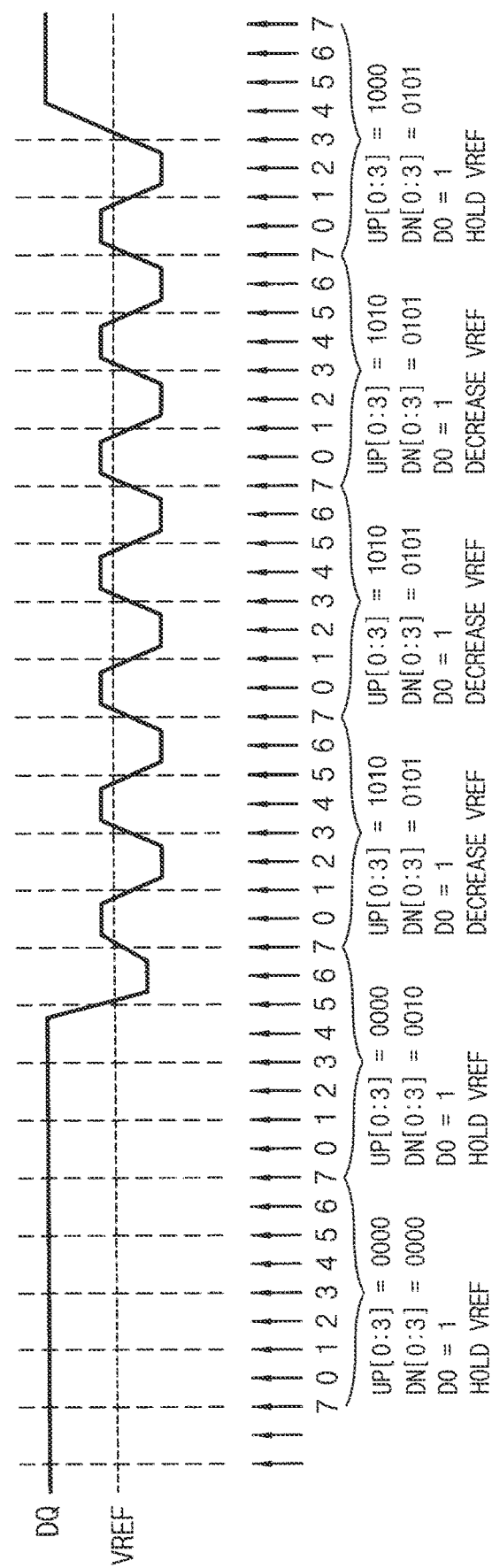
Figure 22D:
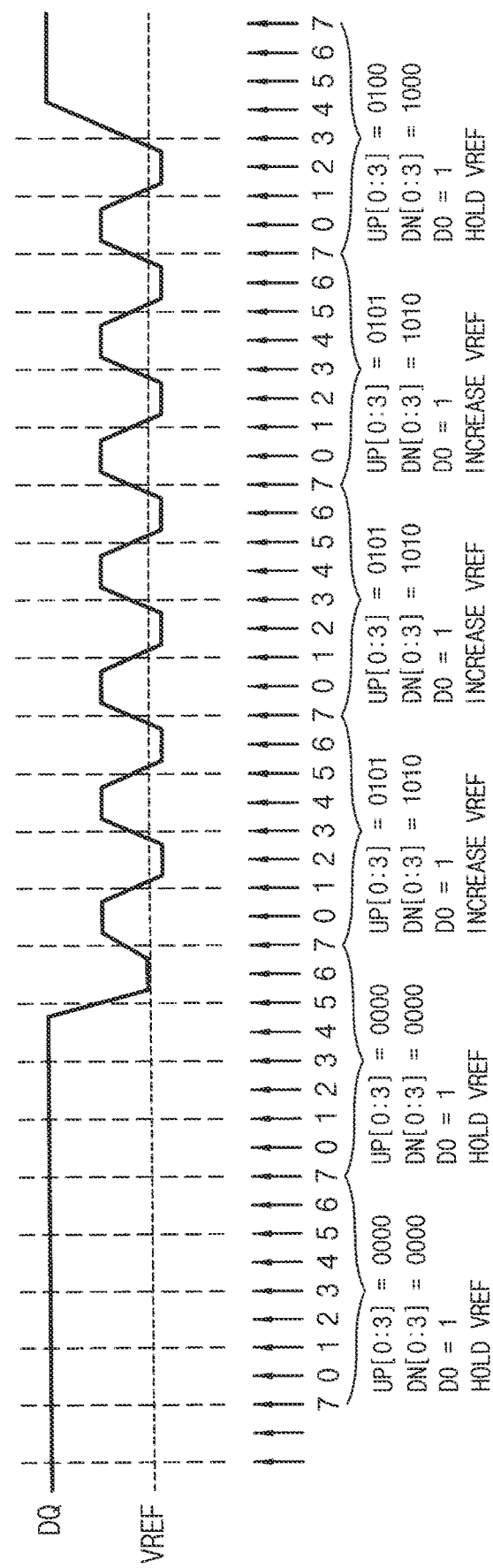

Referring to FIGS. 22C and 22D, examples where the reference voltage VREF is further decreased compared with the example of FIG. 22B to be lower than the high level of the input data signal DQ is illustrated. In these examples, when the input data signal DQ has a pattern of '0101', it may be determined that the reference voltage VREF should be decreased in correspondence with CASE1-1 or CASE1-2 in FIG. 13. In addition, as the reference voltage VREF is further decreased, the voltage level of the reference voltage VREF may become smaller than the optimum offset level, and thus it may be determined that the reference voltage VREF should be increased in correspondence with CASE1-4 or CASE1-5 in FIG. 13.

FIGS. 23A, 23B, 23C, 23D, 23E, 23F, 23G, 23H and 23I are diagrams illustrating other examples of a method of calibrating a clock phase and a voltage offset according to example embodiments. FIGS. 23A, 23B, 23C, 23D, 23E, 23F, 23G, 23H and 23I illustrate examples where both the phases of the plurality of clock signals CLK[0:7] and the voltage level of the reference voltage VREF are adjusted. For convenience of illustration, the plurality of sample data signals are omitted.

Figure 23A:
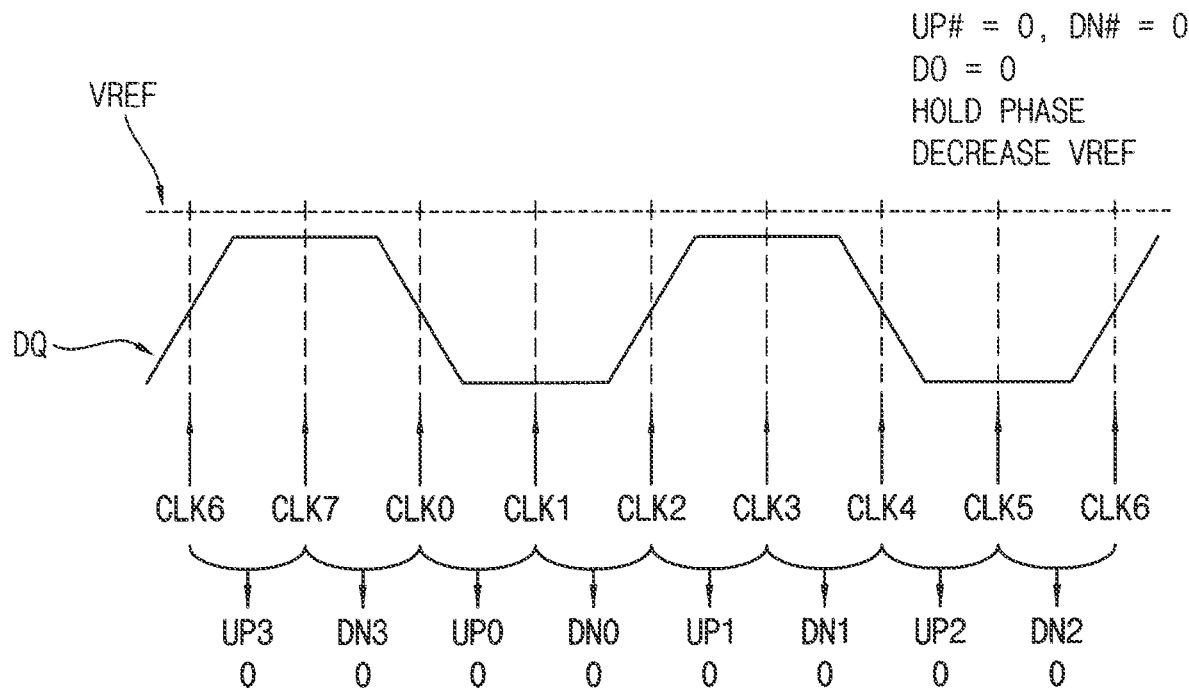
FIGS. 23A, 23B, 23C, 23D, 23E, 23F, 23G, 23H and 23I are diagrams illustrating examples of a method of calibrating a clock phase and a voltage offset, according to example embodiments.

Referring to FIG. 23A, an example (e.g., a worst case) where an initial value of the reference voltage VREF has the highest level (e.g., the VDDQ level) and the first clock signal CLK0 is aligned to an edge of the input data signal DQ is illustrated. Since values of the up signal UP[0:3] and the down signal DN[0:3] are '0000' and a value of the first sample data signal D0 is '0', the reference voltage VREF may be decreased in correspondence with CASE1-3 in FIG. 13.

Figure 23B:
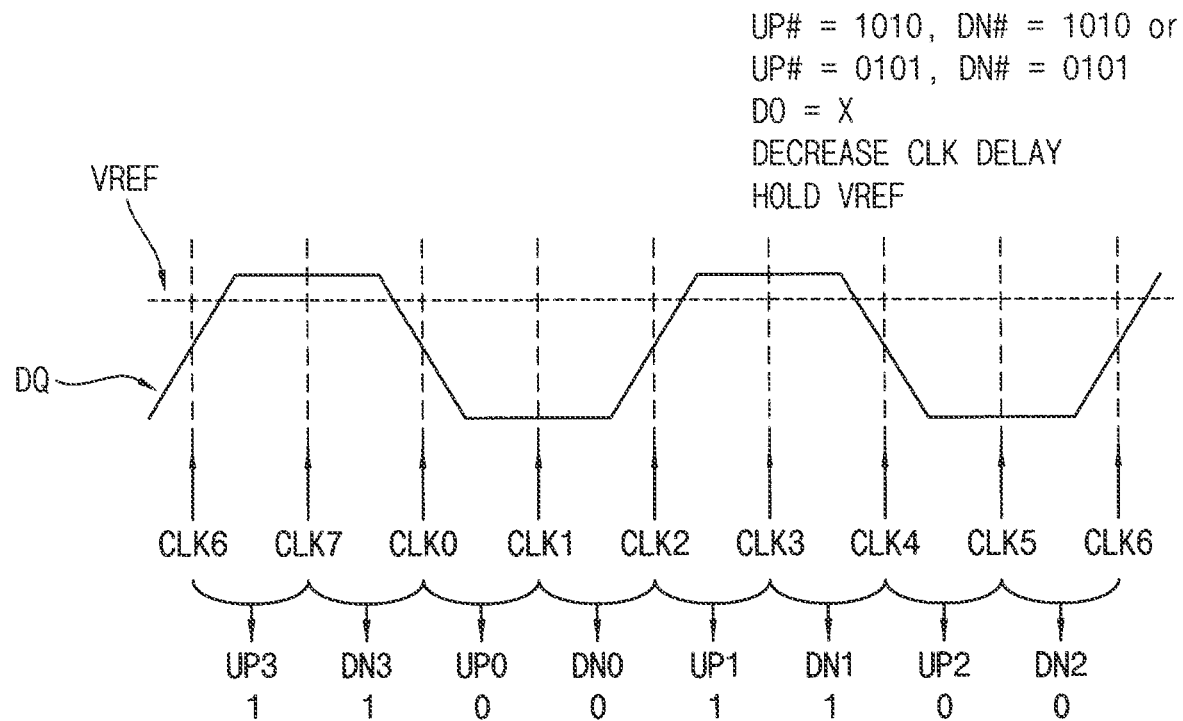

Referring to FIG. 23B, an example (e.g., a special case) where a rising edge of the first clock signal CLK0 is substantially aligned with the edge of the input data signal DQ is illustrated. Since the values of the up signal UP[0:3] and the down signal DN[0:3] are equal to '1010' or '0101', the phases of the plurality of clock signals CLK[0:7] may be pulled forward in correspondence with CASE2-3 or CASE2-4 in FIG. 21.

Figure 23C:
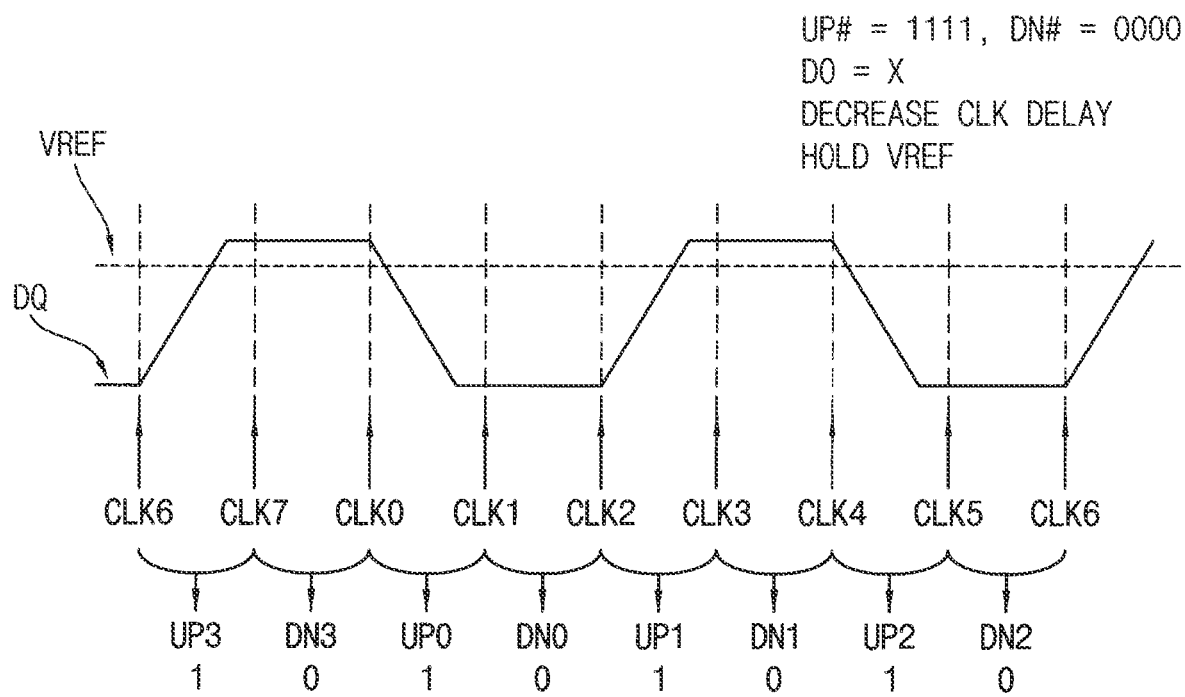

Referring to FIG. 23C, an example where the rising edge of the first clock signal CLK0 moves away from the edge of the input data signal DQ and moves to a center of the input data signal DQ is illustrated. Since the values of the up signal UP[0:3] and the down signal DN[0:3] are '1111' and '0000', respectively, the phases of the plurality of clock signals CLK[0:7] may still be pulled forward in correspondence with CASE2-2 in FIG. 21.

Figure 23D:
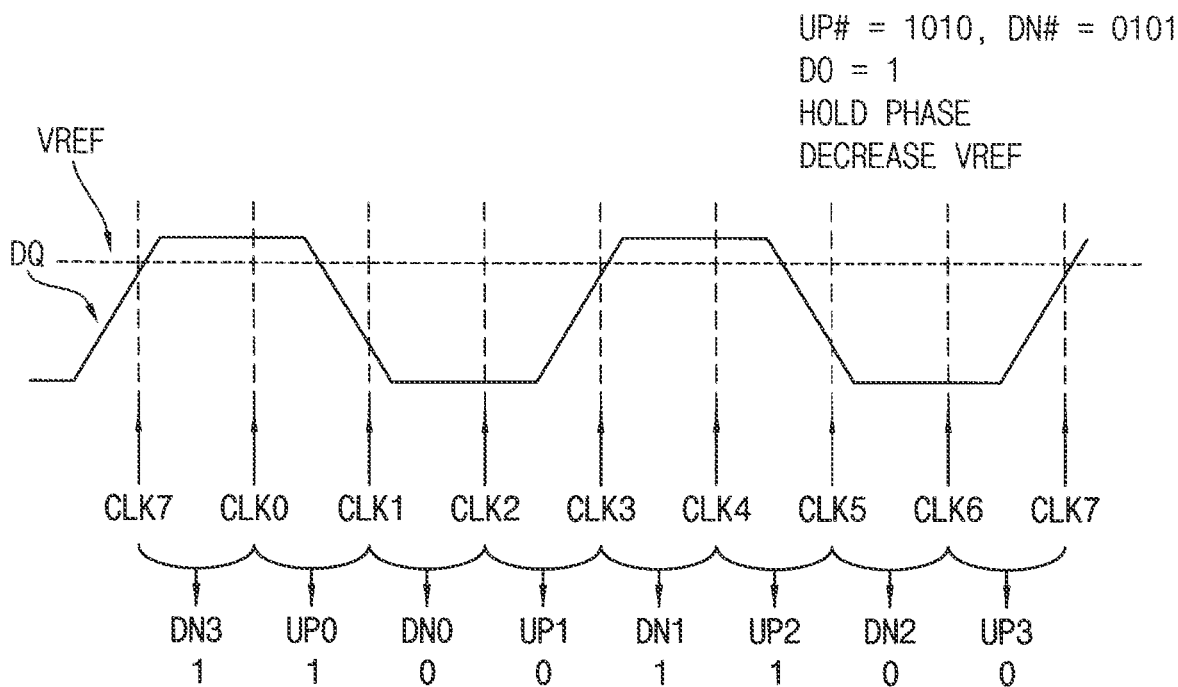

Referring to FIG. 23D, an example where the rising edge of the first clock signal CLK0 is near the center of the input data signal DQ is illustrated. Since the values of the up signal UP[0:3] and the down signal DN[0:3] are '1010' and '0101', respectively, the clock phase update operation may be stopped. Since the value of the first sample data signal D0 is '1', the reference voltage VREF may be decreased in correspondence with CASE1-1 in FIG. 13.

Figure 23E:
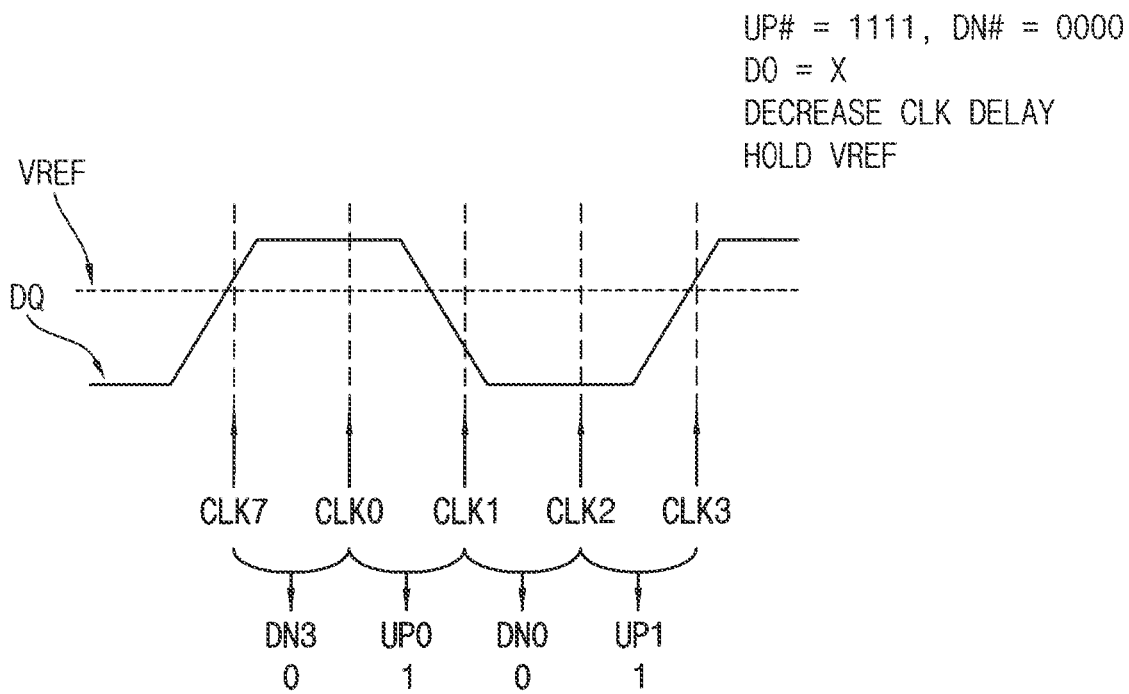

Referring to FIG. 23E, when the reference voltage VREF is decreased, an example similar to that of FIG. 23C may occur again. Since the values of the up signal UP[0:3] and the down signal DN[0:3] are '1111' and '0000', respectively, the phases of the plurality of clock signals CLK[0:7] may be pulled forward in correspondence with CASE2-2 in FIG. 21.

Figure 23F:
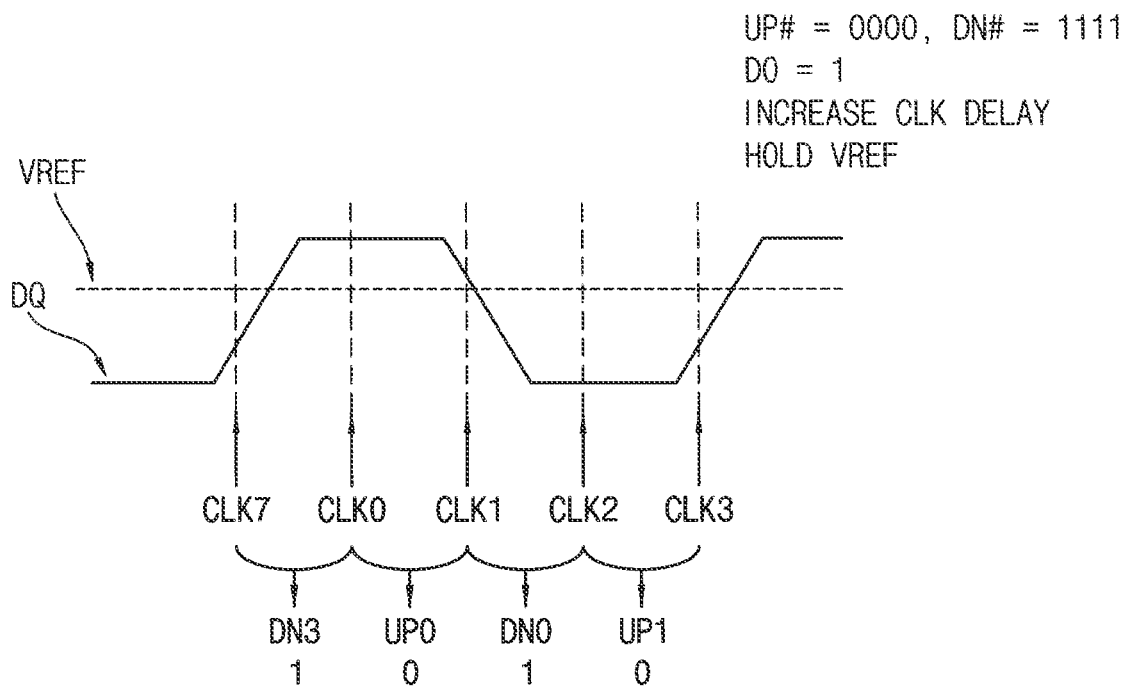

Referring to FIG. 23F, an example where a clock delay step or a clock step (e.g., a unit for increasing or decreasing the clock phase) is relatively large is illustrated. When the clock step is relatively large and the phases of the plurality of clock signals CLK[0:7] are pulled forward to a greater degree, the values of the up signal UP[0:3] and the down signal DN[0:3] may become '0000' and '1111', respectively, which corresponds to CASE2-1 in FIG. 21. Thus, the process may return to the example of FIG. 23E, and the calibration operation may be completed while repeating the operations of FIGS. 23E and 23F. As a result, when a resolution of the clock step is relatively large, not only a phase error but also a voltage offset error may increase.

Figure 23G:
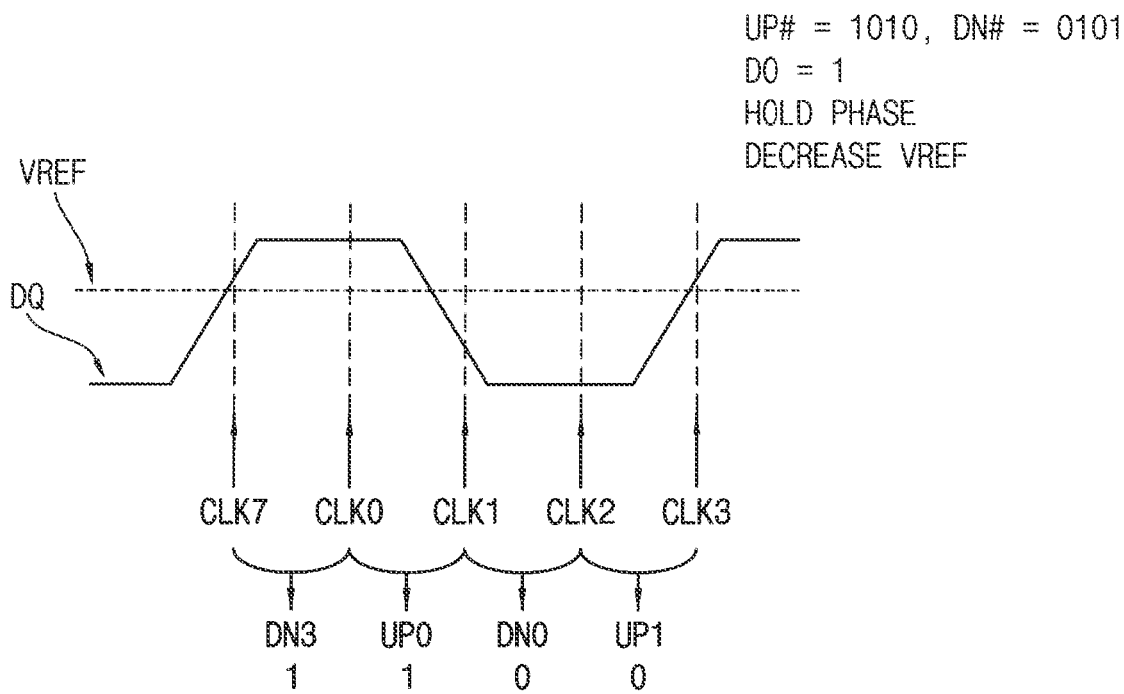

Referring to FIG. 23G, an example where the clock step is decreased to reduce the error is illustrated. When the clock step is decreased, the values of the up signal UP[0:3] and the down signal DN[0:3] may become '1010' and '0101', respectively. Since the value of the first sample data signal D0 is '1', the clock phase update operation may be stopped, and the reference voltage VREF may be decreased in correspondence with CASE1-1 in FIG. 13.

Figure 23H:
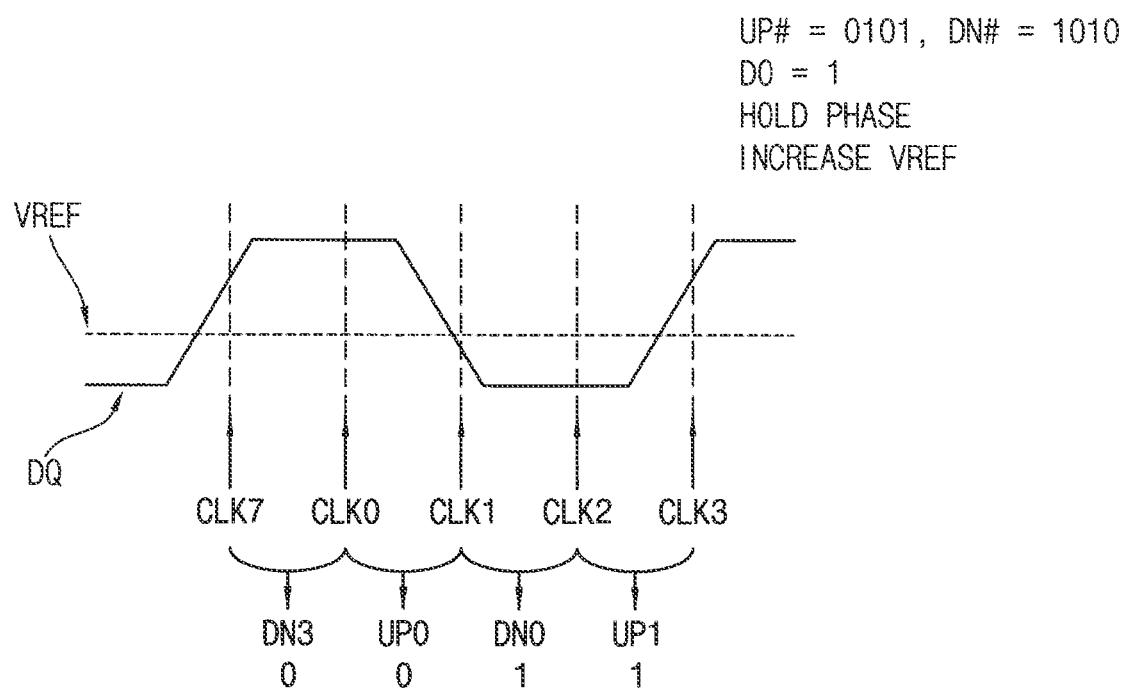

Referring to FIG. 23H, an example where a reference voltage step (e.g., a unit for increasing or decreasing the reference voltage VREF) is relatively large is illustrated. When the reference voltage step is relatively large and the reference voltage VREF is decreased by a larger amount, the values of the up signal UP[0:3] and the down signal DN[0:3] may become '0101' and '1010', respectively, and the value of the first sample data signal D0 may be '1', which corresponds to CASE1-4 in FIG. 13. Thus, the process may return to the example of FIG. 23G, and the calibration operation may be completed while repeating the operations of FIGS. 23G and 23H. As a result, when a resolution of the reference voltage step is relatively large, not only the voltage offset error but also the phase error may increase.

Figure 23I:
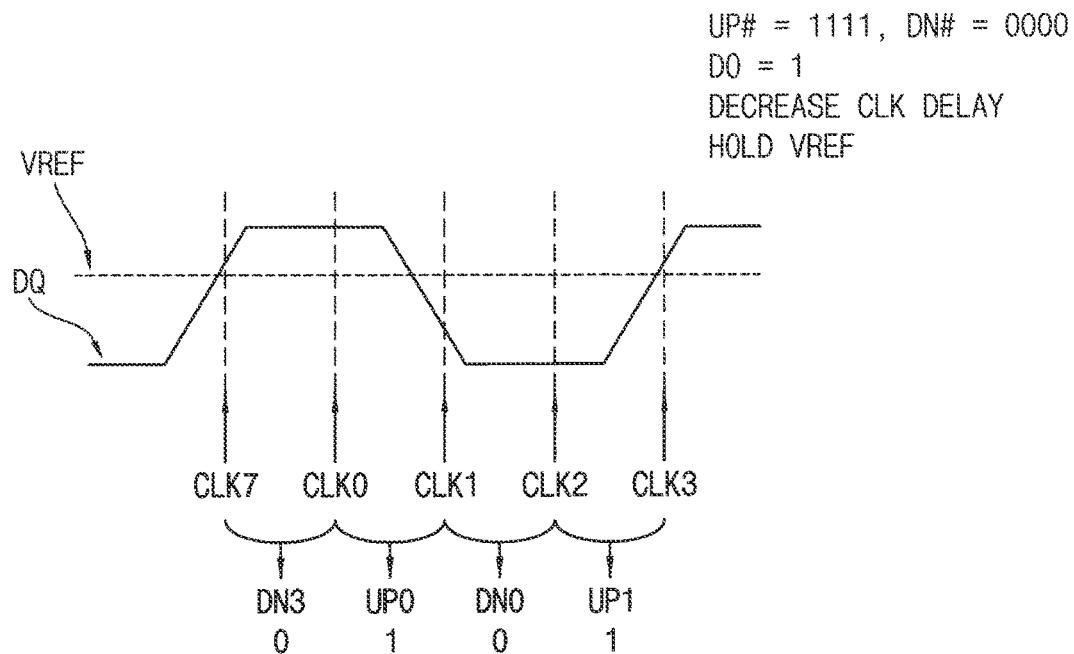

Referring to FIG. 23I, an example where the reference voltage step is decreased to reduce the error is illustrated. When the reference voltage step is decreased, the values of the up signal UP[0:3] and the down signal DN[0:3] may become '1111' and '0000', respectively. Thus, the voltage offset update operation may be stopped, and the phases of the plurality of clock signals CLK[0:7] may be pulled forward in correspondence with CASE2-2 in FIG. 21.

As the above-described processes of FIGS. 23E, 23F, 23G, 23H and 23I are repeatedly performed, the optimal phase of the plurality of clock signals CLK[0:7] and the optimal offset level of the reference voltage VREF may be detected.

In the method of calibrating the clock phase and the voltage offset according to example embodiments, the clock phase calibration operation and the voltage offset calibration operation may be performed substantially at one time, but may not overlap with each other. For example, the voltage level of reference voltage VREF may be maintained when the clock phase calibration operation is performed, and the phases of the plurality of clock signals CLK[0:7] may be maintained when the voltage offset calibration operation is performed. In addition, a calibration accuracy may be increased by minimizing one least significant bit (LSB) (e.g., the clock step or the unit for increasing or decreasing the clock phase) for the clock phase calibration operation and by minimizing one LSB (e.g., the reference voltage step or the unit for increasing or decreasing the reference voltage VREF) for the voltage offset calibration operation. Further, when either the clock phase or the reference voltage VREF is toggled by a size of one LSB (e.g., the period T7 in FIG. 3), all the calibration operations may be completed.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 24:
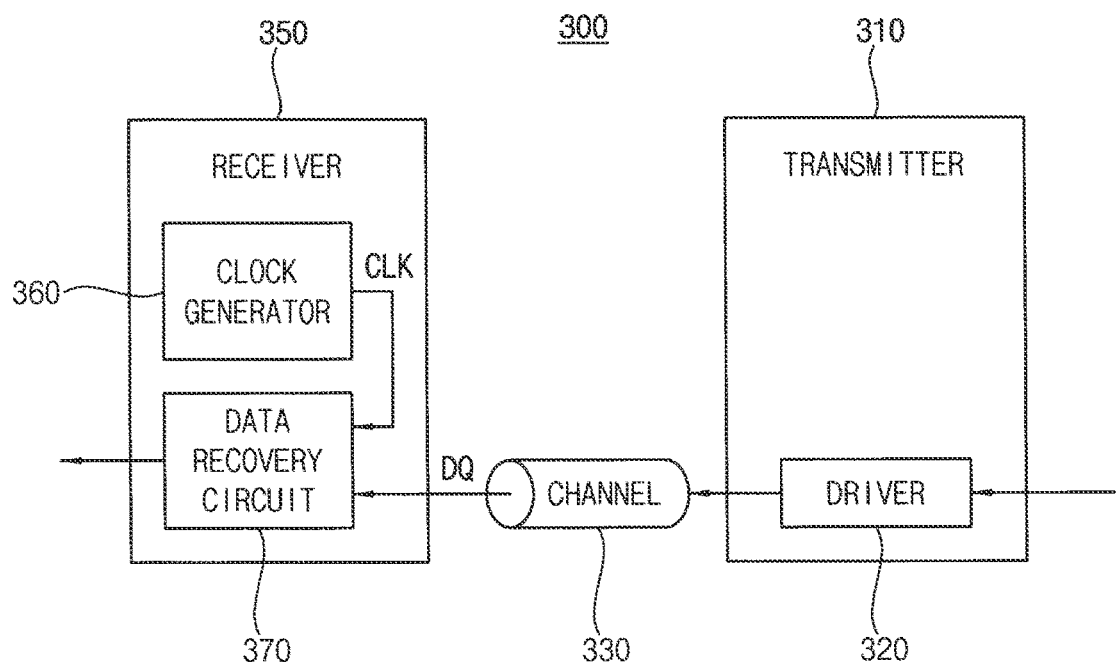
FIG. 24 is a block diagram illustrating a system including a receiver, according to example embodiments.

FIG. 24 is a block diagram illustrating a system including a receiver according to example embodiments.

Referring to FIG. 24, a system 300 may include a transmitter 310, a communication channel 330 and a receiver 350.

The transmitter 310 may transmit an input data signal DQ to the receiver 350 via the communication channel 330. The transmitter 310 may include a driver 320 that transmits the input data signal DQ via the communication channel 330. Although not illustrated in FIG. 24, the transmitter 310 may further include a serializer, a clock generator, etc.

The receiver 350 may include a data recovery circuit 370 that receives the input data signal DQ provided via the communication channel 330. The data recovery circuit 370 may include the data recovery circuit 100 of FIG. 4. The optimal phase of the plurality of clock signals CLK[0:7] and the optimal offset level of the reference voltage VREF may be detected together and at once based on the up signal UP[0:3] and the down signal DN[0:3]. In other words, the voltage offset calibration operation may be performed using signals and circuit configurations for performing the clock phase calibration operation, without using additional signals and circuit configurations for performing the voltage offset calibration operation, and thus power consumption and circuit area may be reduced. Further, the clock phase calibration operation and the voltage offset calibration operation may be performed independently of each other and not to overlap with each other, and thus operational stability may be improved, ensured, or guaranteed.

The receiver 350 may further include a clock generator 360. The clock generator 360 may generate a clock signal CLK (e.g., the plurality of input clock signals CLKIN[0:7] in FIG. 4) to provide the clock signal CLK to the data recovery circuit 370. Although not illustrated in FIG. 24, the clock signal CLK may also be provided to the transmitter 310, and the transmitter 310 may operate based on the clock signal CLK.

Figure 25:
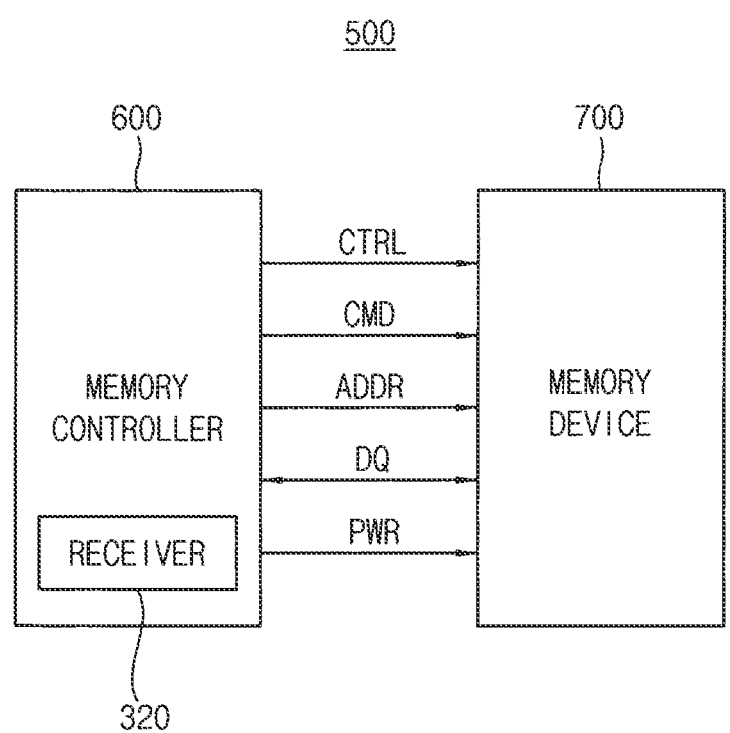
FIG. 25 is a block diagram illustrating a memory system, according to example embodiments.

FIG. 25 is a block diagram illustrating a memory system according to example embodiments.

Referring to FIG. 25, a memory system 500 includes a memory controller 600 and at least one memory device 700.

The memory device 700 may perform data erase, write and/or read operations under control of the memory controller 600. The memory device 700 may receive a command CMD and an address ADDR through I/O lines from the memory controller 600 for performing such operations, and may exchange data DAT with the memory controller 600 for performing such write or read operation. In addition, the memory device 700 may receive a control signal CTRL through a control line from the memory controller 600. In addition, the memory device 700 receives a power PWR through a power line from the memory controller 600.

The memory controller 600 may include a receiver 610 that receives an input data signal DQ from the memory device 700. The receiver 610 may include the receiver 350 in FIG. 24.

In some example embodiments, the memory device 700 may include at least one volatile memory such as a dynamic random access memory (DRAM), a synchronous DRAM (SDRAM), a static random access memory (SRAM), etc., and/or at least one nonvolatile memory such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), or a polymer random access memory (PoRAM), etc.

Figure 26:
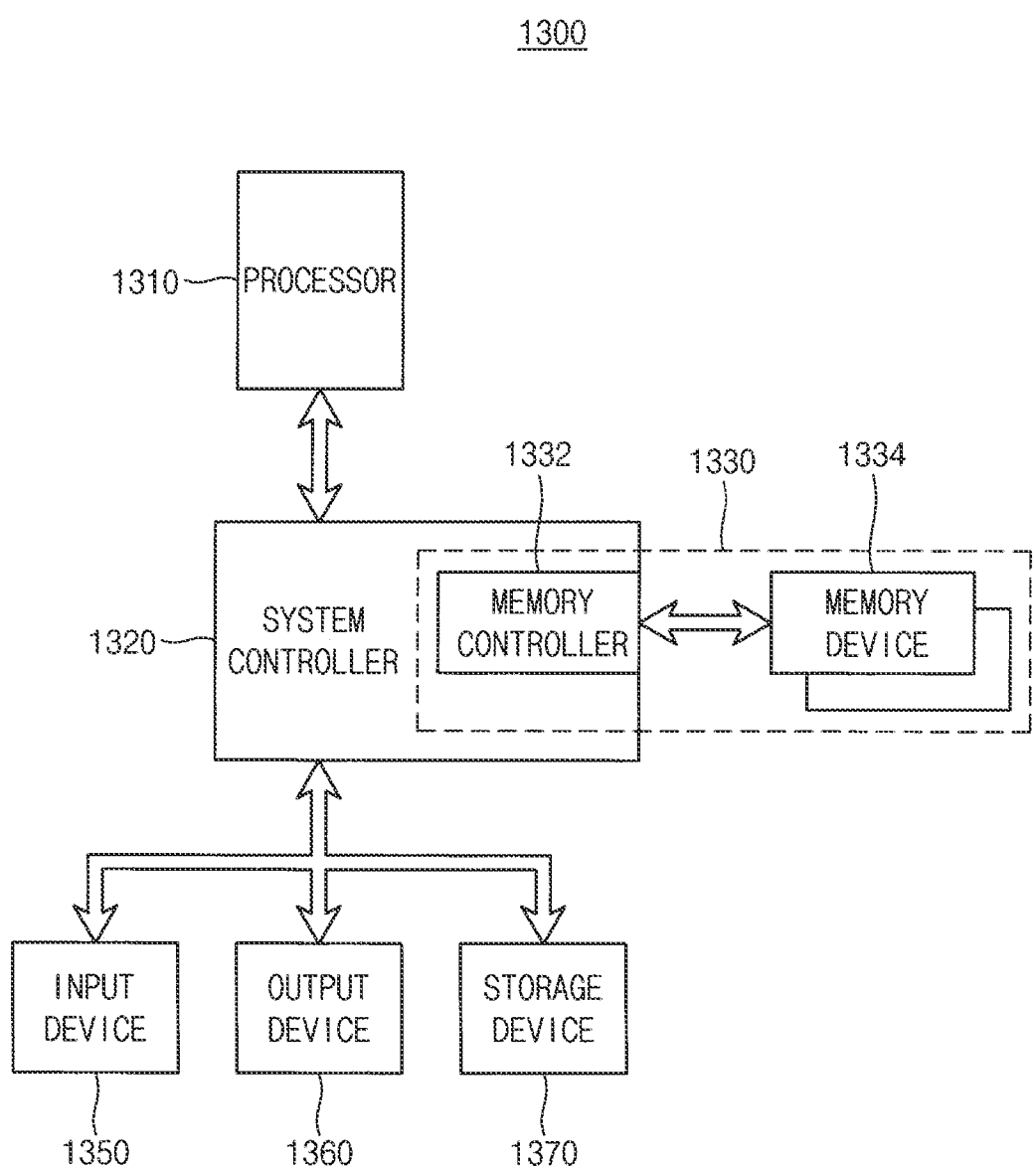
FIG. 26 is a block diagram illustrating a computing system, according to example embodiments.

FIG. 26 is a block diagram illustrating a computing system according to example embodiments.

Referring to FIG. 26, a computing system 1300 includes a processor 1310, a system controller 1320 and a memory system 1330. The computing system 1300 may further include an input device 1350, an output device 1360 and a storage device 1370.

The memory system 1330 includes a plurality of memory devices 1334, and a memory controller 1332 for controlling the memory devices 1334. The memory modules 1334 may include at least one memory device. The memory controller 1332 may be included in the system controller 1320. The memory system 1330 may include the memory system 500 of FIG. 25.

The processor 1310 may perform various computing functions, such as executing specific software instructions for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The inventive concept may be applied to various electronic devices and systems including the data recovery circuits. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A circuit comprising:
an analog front-end (AFE) configured to receive an input data signal, and configured to generate a data signal corresponding to the input data signal based on the input data signal and a reference voltage;
a sampler configured to sample the data signal based on respective ones of a plurality of clock signals to generate respective ones of a plurality of sample data signals;
a phase detector configured to generate an up signal and a down signal based on ones of the plurality of sample data signals; and
a finite state machine (FSM) configured to perform a clock phase calibration operation if the up signal and the down signal comply with a first condition, and configured to perform a voltage offset calibration operation if the up signal and the down signal comply with a second condition,
wherein the first condition and the second condition are disjoint.

2. The circuit of claim 1, wherein the FSM is configured to maintain or hold to a current voltage level and/or current phases if the up signal and the down signal comply with a third condition.

3. The circuit of claim 1 further comprising a reference voltage generator.

4. The circuit of claim 1 further comprising a clock phase controller.

5. The circuit of claim 3, wherein the FSM is configured to generate a voltage offset control signal and configured to transmit the voltage offset control signal to the reference voltage generator for performing the voltage offset calibration operation.

6. The circuit of claim 4, wherein the FSM is configured to generate a clock phase control signal and configured to transmit the clock phase control signal to the clock phase controller for performing the clock phase calibration operation.

7. The circuit of claim 1, wherein the FSM is implemented in a form of a digital loop filter.

8. The circuit of claim 1, wherein the sampler is configured to directly transmit a first sample data of the plurality of sample data signals to the FSM.

9. The circuit of claim 8, wherein when the up signal and the down signal satisfy the first condition, a voltage level of the reference voltage is increased or decreased depending on a logic level of the first sample data of the plurality of sample data signals.

10. The circuit of claim 1, wherein the phase detector comprises at least one XOR gate.

11. A method of calibrating a clock phase and a voltage offset, the method comprising:
receiving an input data signal that is periodically toggled;
performing a clock phase calibration operation based on an up signal and a down signal, wherein respective phases of a plurality of clock signals are configured to be adjusted by the clock phase calibration operation, and wherein the up signal and the down signal are generated based on the input data signal, a reference voltage and the plurality of clock signals; and
performing a voltage offset calibration operation based on the up signal, the down signal and a first sample data signal, wherein a voltage level of the reference voltage is adjusted by the voltage offset calibration operation, wherein the first sample data signal is generated by sampling the input data signal based on one of the plurality of clock signals,
wherein the clock phase calibration operation is performed if the up signal and the down signal comply with a first condition,
wherein the voltage offset calibration operation is performed if the up signal and the down signal comply with a second condition, and
wherein the first condition and the second condition are disjoint.

12. The method of claim 11, wherein performing the voltage offset calibration operation comprises:
determining whether the up signal and the down signal are equal to each other to generate a first determination result;
determining an arrangement of a plurality of first bits included in the up signal and an arrangement of a plurality of second bits included in the down signal to generate a second determination result;

determining a logic level of the first sample data signal to generate a third determination result; and generating a voltage offset control signal for increasing the voltage level of the reference voltage or decreasing the voltage level of the reference voltage based on the first, second and third determination results.

13. The method of claim 12, wherein the voltage offset control signal for decreasing the voltage level of the reference voltage is generated when the up signal and the down signal are different from each other, when the up signal has a first value in which a first bit value and a second bit value that are different from each other are alternately repeated in a first arrangement, when the down signal has a second value in which the first bit value and the second bit value are alternately repeated in a second arrangement that is different from the first arrangement, and when the first sample data signal has a first logic level.

14. The method of claim 13, wherein the voltage offset control signal for decreasing the voltage level of the reference voltage is generated when the up signal and the down signal are different from each other, when the up signal has the second value, when the down signal has the first value, and when the first sample data signal has a second logic level that is different from the first logic level.

15. The method of claim 13, wherein the voltage offset control signal for increasing the voltage level of the reference voltage is generated when the up signal and the down signal are different from each other, when the up signal has the second value, when the down signal has the first value, and when the first sample data signal has the first logic level.

16. The method of claim 13, wherein the voltage offset control signal for increasing the voltage level of the reference voltage is generated when the up signal and the down signal are different from each other, when the up signal has the first value, when the down signal has the second value, and when the first sample data signal has a second logic level that is different from the first logic level.

17. The method of claim 13, wherein the voltage offset control signal for decreasing the voltage level of the reference voltage is generated when the up signal and the down signal are equal to each other, when each of the up signal and the down signal has a third value in which only the second bit value is repeated, and when the first sample data signal has a second logic level that is different from the first logic level.

18. The method of claim 13, wherein the voltage offset control signal for increasing the voltage level of the reference voltage is generated when the up signal and the down signal are equal to each other, when each of the up signal and the down signal has a third value in which only the second bit value is repeated, and when the first sample data signal has the first logic level.

19. The method of claim 11, wherein performing the clock phase calibration operation comprises:

generating a first determination result based on determining whether the up signal and the down signal are equal to each other;

generating a second determination result based on determining an arrangement of a plurality of first bits included in the up signal and an arrangement of a plurality of second bits included in the down signal; and generating a clock phase control signal for increasing or decreasing respective delays of the plurality of clock signals based on the first and second determination results.

20. The method of claim 19, wherein the clock phase control signal for increasing the respective delays of the plurality of clock signals is generated when the up signal and the down signal are different from each other, and when a number of first bit values included in the down signal is greater than a number of first bit values included in the up signal.

21. The method of claim 20, wherein the clock phase control signal for decreasing the respective delays of the plurality of clock signals is generated when the up signal and the down signal are different from each other, and when the number of first bit values included in the up signal is greater than the number of first bit values included in the down signal.

22. The method of claim 19, wherein the clock phase control signal for decreasing the respective delays of the plurality of clock signals is generated when the up signal and the down signal are equal to each other, and when each of the up signal and the down signal has a first value in which a first bit value and a second bit value that are different from each other are alternately repeated in a first arrangement.

23. The method of claim 22, wherein the clock phase control signal for decreasing the respective delays of the plurality of clock signals is generated when the up signal and the down signal are equal to each other, and when each of the up signal and the down signal has a second value in which the first bit value and the second bit value are alternately repeated in a second arrangement that is different from the first arrangement.

\* \* \* \* \*